US012800512B2

(12) United States Patent
Weeks et al.

(10) Patent No.: US 12,800,512 B2
(45) Date of Patent: Nov. 17, 2026

(54) ADAPTIVE AND RETROSPECTIVE ENDPOINT DETECTION FOR AUTOMATED DELAYERING OF SEMICONDUCTOR SAMPLES

(71) Applicant: FEI Company, Hillsboro, OR (US)

(72) Inventors: Sophia E. Weeks, Portland, OR (US); Umesh Adiga, Portland, OR (US)

(73) Assignee: FEI Company, Hillsboro, OR (US)

( * ) Notice: Subject to any disclaimer, the term of this patent is extended or adjusted under 35 U.S.C. 154(b) by 490 days.

(21) Appl. No.: 18/221,603

(22) Filed: Jul. 13, 2023

(65) Prior Publication Data

US 2024/0094142 A1 Mar. 21, 2024

Related U.S. Application Data

(60) Provisional application No. 63/407,354, filed on Sep. 16, 2022.

(51) Int. Cl.

| | |
|---|---|
| ***G01N 21/95*** | (2006.01) |
| ***G01N 30/86*** | (2006.01) |
| ***H10P 74/00*** | (2026.01) |

(52) U.S. Cl.
CPC ..... *G01N 21/9501* (2013.01); *G01N 30/8637* (2013.01); *H10P 74/238* (2026.01)

(58) Field of Classification Search
CPC ............ G01N 21/9501; G01N 30/8637; H10P 74/238
See application file for complete search history.

(56) References Cited

U.S. PATENT DOCUMENTS

| | | | | |
|---|---|---|---|---|
| 11,171,048 | B2 | 11/2021 | Morgan-Jones et al. | |
| 2021/0287938 | A1 * | 9/2021 | Morgan-Jones | G01N 1/32 |
| 2023/0215689 | A1 † | 7/2023 | Sharang | |

* cited by examiner
† cited by third party

*Primary Examiner* — Yuechuan Yu
(74) *Attorney, Agent, or Firm* — Klarquist Sparkman, LLP

(57) ABSTRACT

Adaptive endpoint detection is applied to delayering of a multi-layer sample utilizing a combination of dynamic and predetermined parameters. Retrospective evaluation of peaks and troughs can re-classify endpoints as signal properties emerge, enabling accurate mapping of endpoints to layers. The described techniques can be integrated with analysis operations and can be applied across a wide range of device types and manufacturing processes.

21 Claims, 18 Drawing Sheets

602

| | |
|---|---|
| **<u>0 SAMPLE INFORMATION</u>** | |
| 0.1 STACK HEIGHT | 11 |
| 0.2 NO. OF THICK METAL LAYERS | 4 |
| **1 SITE INFORMATION** | |
| 1.1 SITE NAME | ALU_04 |
| 1.2 FOLDER DESTINATION | C:\SAMPLE\ |
| **2 USER INPUTS** | |
| 2.1 DELAYER AND IMAGE TYPE | METAL_METAL |
| 2.2 START LAYER FOR IMAGING | 5 |
| 2.3 END LAYER NUMBER | 11 |
| 2.4 CONTACT DELAYER | TRUE |
| 2.5 DELAYERING SIZE | (50 µm, 50 µm) |
| 2.6 POLISH TIME | 0 ns |
| **3 RECOVERY OPTIONS** | |
| 3.1 RECOVERY FLAG | FALSE |

ADAPTIVE AND RETROSPECTIVE ENDPOINT DETECTION FOR AUTOMATED DELAYERING OF SEMICONDUCTOR SAMPLES

CROSS REFERENCE TO RELATED APPLICATIONS

This application claims the benefit of U.S. Provisional Application No. 63/407,354, filed on Sep. 16, 2022, which is incorporated herein by reference in its entirety.

FIELD

The disclosure pertains to sample preparation for evaluation of multilayer structures.

BACKGROUND

Delayering of semiconductor devices plays an important role in process characterization and maintenance. It is often desirable to etch a device up to an endpoint at a particular layer and perform analysis or metrology at that layer. However, there can be significant variations in monitor signals between device classes, between different products of a class, between different samples of a product, and between different sites on a single sample. Accordingly, automation of the delayering process has been challenging, and significant operator input is often required. This can be a particular issue for multi-shift production lines, where operators with the requisite skills may not be available on all shifts. Previous attempts at automation have required numerous trials to establish suitable parameters for endpoint detection. Optimal parameters can vary from site to site on a given sample, or between delayering runs. Accordingly, there remains a need for improved technology to automate the delayering process.

SUMMARY

Methods and apparatus are disclosed for preparation and execution of automated delayering of a multi-layer sample using adaptive and retrospective endpoint detection. In brief, delayering of a sample is monitored using a monitoring signal. As the monitoring signal reveals itself over time, the disclosed technologies use updated properties of the monitoring signal to re-characterize earlier endpoints retrospectively, thereby improving accuracy of layer identification for past, current, and future endpoints. Improved outcomes can be achieved for sample analysis, and for the delayering process itself.

In certain examples, the disclosed technology can be implemented as a system incorporating an etcher, computer-readable media storing program instructions, and one or more hardware processors, with coupled memory, configured to execute the program instructions and cause the apparatus to perform the following operations. A sample is delayered while monitoring one or more signals from the sample. Successive layers of the sample are identified based on reference points (e.g. peaks or troughs) of the monitored signal(s). Responsive to detection of a given inflection of the monitored signal(s), a layer identification of a prior peak or trough is changed retrospectively. Delayering is suspended when a predetermined target layer of the sample is reached. Identification of the predetermined target layer is dependent on the changed layer identification.

The foregoing and other objects, features, and advantages of the disclosed technologies will become more apparent from the following detailed description, which proceeds with reference to the accompanying figures.

DETAILED DESCRIPTION

Terminology

Figure 1:
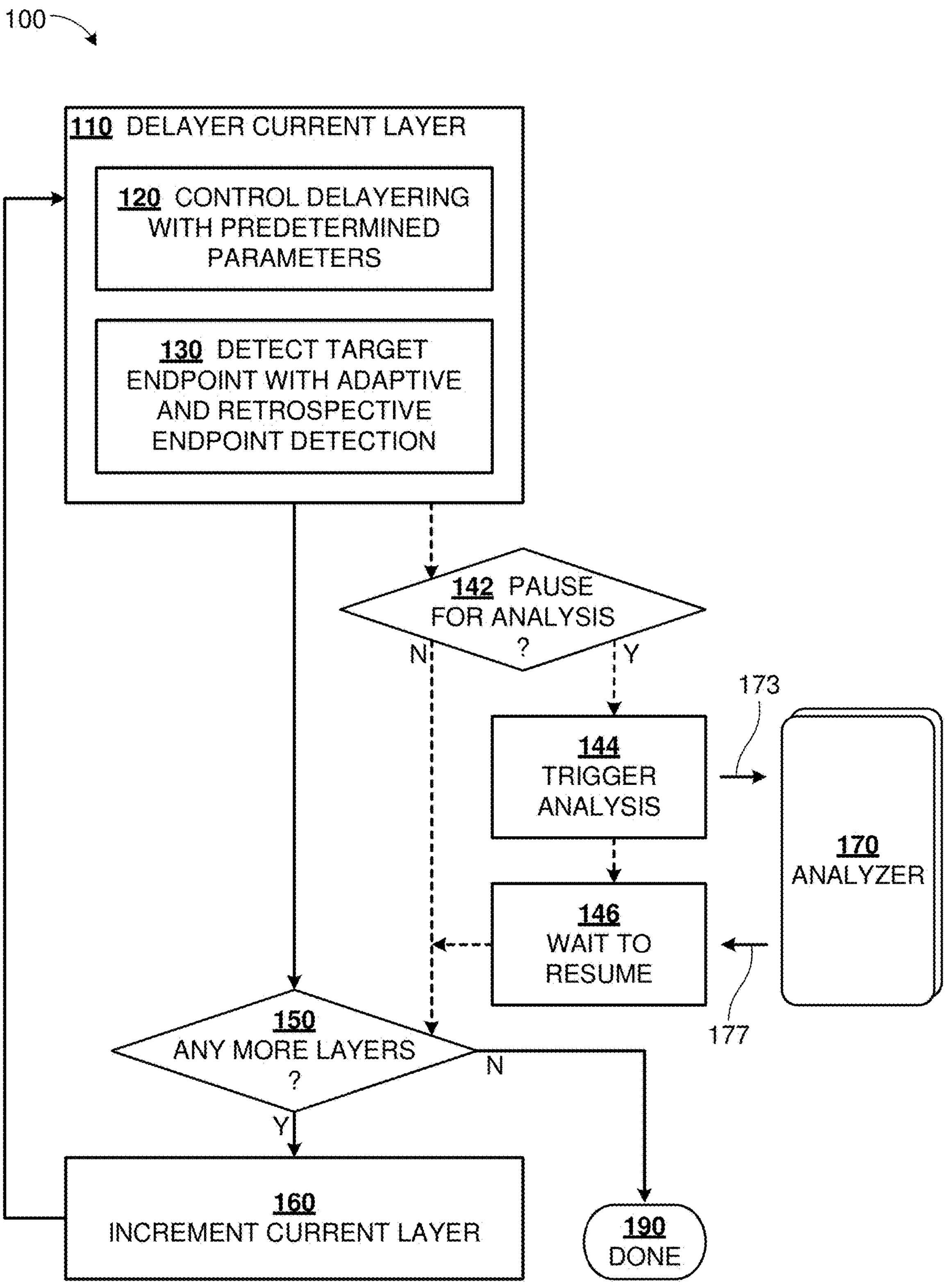
FIG. 1 is a flowchart of a first example automated method for delayering successive layers of a sample, according to the disclosed technologies.

The usage and meaning of all quoted terms in this section applies throughout this disclosure unless clearly indicated otherwise or repugnant to the context. The terminology below extends to related word forms.

The term "active layer" or "active contact layer" refers to a layer or group of sub-layers of a device in which contacts to active semiconductor structures (e.g. diodes; transistors, including bipolar or field-effect transistors; memory cells; or optoelectronic devices) are formed. The active layer can have a mask pattern or can have portions with different doping characteristics. The active layer can incorporate electrodes or contacts to active structures. A layer is active irrespective of whether the semiconductor device is powered on or operational.

The term "adaptive" refers to a method, system, or technology that can autonomously adjust its operational characteristics in response to changing input or environmental conditions. For an adaptive entity having one or more inputs and one or more outputs, the output(s) for given input(s) can vary according to a state of the adaptive entity. Further, the input(s) required to obtain given output(s) can vary according to the state of the adaptive entity. Some adaptive parameters can be retrospectively applied to re-evaluate past peaks or troughs of a monitoring signal, as described herein.

The term "amplitude" refers to a magnitude of a monitoring signal, e.g. at a reference point such as peak or trough. The amplitude can be an absolute value or a relative value of the monitored signal. A relative amplitude can be relative to a baseline, which can be a signal value at a neighboring reference point (e.g. peak or trough), or an average or low-pass-filtered value of the monitored signal. To illustrate with reference to a signal having mean of 10 and a peak with signal value equal to 20 in between troughs having signal values of 2 and 6, the peak amplitude can be measured as 10 (relative to the mean), as 18 (relative to the preceding trough), as 16 (relative to the mean of the two neighboring troughs), or as 20 (its absolute value) in respective embodiments.

The term "amplitude threshold" refers to a magnitude or change in magnitude of a monitoring signal which can be used to discriminate desired peaks or troughs from e.g. noise. The amplitude threshold can be an absolute value or a relative value of the monitored signal. A relative amplitude threshold can be relative to an amplitude of a preceding peak or trough, or relative to an average or low-pass-filtered value of the monitored signal. To illustrate with reference to a peak, a leading edge exceeding an amplitude threshold can indicate that a subsequent peak (not necessarily the first peak encountered) can be identified as endpoint of the next layer, and a trailing edge exceeding an amplitude threshold can confirm a recent peak as endpoint of a most recent layer, with subsequent peaks being identified with subsequent layers. Amplitude thresholds for leading edges, trailing edges, peaks, or troughs can be same or different, in any combination. The relative amplitude and amplitude threshold of a trough are considered to be positive numbers.

The term "analysis" and "analyzer" pertain to operations to characterize a sample, and equipment or instrumentation for performing such operations. Analysis can include various forms of imaging, probe measurements of electrical properties, or non-contact optical measurements. During a delayering procedure, analysis can be performed at one or more layers exposed through delayering, before proceeding to successive layers. Some analysis can require preparation of the exposed surface, e.g. by polishing, prior to performing the analysis. Some analysis can require that etching action be suspended for analysis to be performed, while other analytic techniques can be conducted on-the-fly during an etching action.

The term "base layer" refers to a lowest layer of interest in a sample. In samples that are electronic structures, the base layer can be an electrically conducting layer or an active layer.

The term "delayer" refers to a subtractive process for removing one or more layers of a multi-layer sample, for example by etching (including milling).

The term "endpoint" refers to a location of a layer or layer surface reached in a delayering process. In an automated delayering procedure, reaching an endpoint can be detected automatically based on monitoring one or more signals from the sample or the etching apparatus. Etching can stop or pause at a given endpoint, however that is not a requirement. In some examples, an endpoint can be detected, logged, and the delayering can proceed without pausing. The delayering can pause or stop when an endpoint of a predetermined target layer is reached. In some examples, endpoints can be labeled Peak or Trough according to whether the endpoints correspond to positive or negative excursions of a monitoring signal, respectively. However, this is not a requirement, and other reference points in between peaks and troughs, e.g based on signal slope or zero-crossing, can also be used as endpoints. Accordingly, description of peaks or troughs herein as endpoints or candidate endpoints also encompasses such other reference points. Still further, reference points can be designated for non-periodic waveforms or waveforms having combinations of multiple signal frequencies. A reference point can be a pattern specified for such a signal, not limited to inflections. For example, non-periodic waveforms can be encountered in complex three-dimensional structures, and the patterns for such waveforms can also be subject to confirmation criteria and retrospective analysis, similar to peaks and troughs of examples described herein. Commonly, endpoints can define a location (depth) at which a given layer is present. Inasmuch as a layer has a finite thickness spanning a range of depths, the endpoint can be located within that range. An analysis performed at the endpoint can be representative of the associated layer.

The term "endpoint detection" refers to a procedure for identifying endpoints (e.g. based on monitoring signals) of respective layers of a sample. Generally, inflections in a monitoring signal can be detected, and some can be logged in a buffer as candidate endpoints, subject to subsequent confirmation. In some cases, an endpoint can be confirmed "directly", i.e. before the delayering has reached an endpoint of a following layer. In other cases, an endpoint can be confirmed retrospectively, based on re-evaluation of monitoring signal history as more information is collected during delayering. In varying examples, retrospective evaluation can demote a previously confirmed endpoint to a disregarded inflection, confirm a candidate endpoint not previously confirmed, or change the layer with which a confirmed endpoint is associated. Confirmation of a candidate endpoint can indicate that the candidate endpoint presently satisfies requisite criteria, however as a monitored signal reveals itself, criteria and be updated and a previously confirmed endpoint can fail to satisfy updated criteria, leading to its demotion through retrospective re-evaluation.

The term "etch" refers to a subtractive process for removal of material from a sample. Etching can be performed by a variety of techniques including, without limitation, ion beam milling, chemical etch (in liquid or gas phase), plasma etch, mechanical milling, grinding, or chemical-mechanical polishing, or by a combination of techniques. For example, ion beam assisted gas etching can be used in some embodiments of the disclosed technology. An "etcher" is an apparatus or system operable to perform etching by any of the techniques listed above, singly or in combination, or by another technique. Commonly, etching can be performed according to a pattern, however this is not a requirement. Patterning can be achieved through the use of a mask, or by e.g. scanning an ion beam to cover the desired pattern.

The term "etch rate" or "etching rate" refers to a rate at which material is removed from a surface by an etching process, and can be measured in nm/s.

An "etching procedure" can include at least one period of time (dubbed an "etching action") over which sample material is continuously being removed, as well as optional quiescent periods, e.g. for purging a gas environment, recharging a beam source, retrace of a raster scan, or an analytic measurement on the sample.

The term "etch stop" refers to a sample location in an etching process at which etching rate drops, as at a particular layer of a sample. An etch stop can aid endpoint detection, however the disclosed technologies can be applied without reliance on any etch stop.

The term "focused ion beam" (FIB) refers to a beam of ions arranged to focus at a spot on a surface. A FIB can be used for analysis, deposition, or removal of material at the focus spot. Commonly, a FIB comprises positive elemental ions, such as Xe+ or Ga+, however these are not requirements. Ion beam species such as Ga+ can be sourced from e.g. a liquid metal ion source (LMIS), while other ion beam species such as Xe+ can be produced in a plasma. A FIB produced with a plasma source can be termed a plasma focused ion beam (PFIB). Commonly, a FIB can be scanned over a pattern on a surface for an analysis, deposition, or removal procedure.

In the context of a delayering endpoint, the term "identify" refers to forming an association between a reference point (e.g. peak or trough) of a monitoring signal and a particular layer of a delayered sample. Because the monitoring signal is indicative of delayering depth, identification can establish a location (e.g. depth) of the identified layer.

The term "image" refers to a two-dimensional representation of a parameter value over a region of interest of a sample. In examples, the region of interest can be an area over which a sample is being delayered, the image can be an SEM image, and the parameter value can be an intensity of secondary electron emission, e.g. a measured electrical current of secondary electrons.

The term "inflection" refers to a sequence of three or more monitoring datapoints (such as d1, d2, d3) in which d2−d1 and d3−d2 have opposite sign. A "peak" inflection occurs when d2 is greater than both d1 and d3, while a "trough" inflection occurs when d2 is less than both d1 and d3. Determination of an inflection can be performed by testing inequalities, by computing differences, by comparing slopes, or by other techniques. In some examples, an inflection can be detected over a larger number of consecutive datapoints (such as $d_1, d_2, \ldots d_{N-1}, d_N$), where intermediate points are generally constant. That is, $d_2-d_1$ and $d_N-d_{N-1}$ can have opposite sign and a magnitude exceeding a threshold (which can be zero), while for K=3 to N−1, $|d_K-d_{K-1}$ does not exceed the threshold. A succession of inflections can identify or indicate the depth of a corresponding succession of layers of a sample. To illustrate, peak P1, trough T2, and peak P3 can identify corresponding metal, via, and metal layers of the sample, and the etch depths at which these inflections are encountered can be used as depth coordinates for the associated layers. Any of such inflections can identify an endpoint in a delayering procedure. However, not all inflections are necessarily endpoints. During delayering, additional inflections can also be encountered, for example due to noise, due to the waveform of the monitoring signal, or due to other artifacts. Inflections other than endpoints are termed "disregarded". To illustrate, the monitoring signal at one layer may have a primary peak and a secondary shoulder. The primary peak can identify or locate the layer, while the secondary shoulder (and any trough between the secondary shoulder and the primary peak) can be disregarded. As another illustration, the monitoring signal at a second layer can have a double-dip waveform, one of the dips being a primary trough (which can identify or locate the second layer) and the other dip being a disregarded secondary trough.

The term "layer" refers to a region of a sample having a transverse extent parallel to a surface of the sample, at some depth, with some material characteristic to distinguish the layer from material at greater and/or lesser depths. Layers can be of various types. Semiconductor devices can have metal, via, and active layer types, while other classes of devices can have additional or different layer types. Some layers are substantially homogeneous, such as a metallization ground plane, while other layers are heterogeneous to varying degrees. For example, a "metal layer" can have at least 5%, 10%, 20%, or 50% of its transverse area formed by metal, including metal traces having lengthwise extents in one or more directions as well as metal islands, with insulating material separating neighboring metal traces or islands. For example, a "via layer" can have conductive pillars distributed in primarily insulating material, with less than 5%, 10%, 20%, or 50% of the layer's transverse area formed by the conductive material. For example, an "active layer" can have a mask pattern or can have portions with different doping characteristics and electrodes or bodies of active devices occupying a small or large fraction of the layer's transverse area; nevertheless, the active layer can be readily distinguished from other layers above or below. A layer can be identified by its largest material constituent by area or volume; alternatively, a layer can be identified functionally, such as a photonic waveguide layer or a metallization layer, even when such layer predominantly contains non-functional or inert material. Layers are numbered herein in the order encountered during delayering, with distinct layers having distinct numbers. (Other layer numbering schemes are also used in the art.) To illustrate, "Metal-1" can refer to the metal layer highest above a device substrate, which is the first metal layer encountered while delayering from above. The next encountered layers can be "Via-2", "Metal-3", and "Via-4". A "zone" of layers can be a set of two or more contiguous layers (i.e. successive layers with no gaps) within a device. To illustrate the layers from Metal-1 to Metal-5 (including Via-2, Metal-3, Via-4, and any other layers in between) can form a zone. A "group" of layers can be a set of two or more layers which need not be contiguous (i.e. the group of layers can have one or more gaps). To illustrate, the layers Via-2, Via-4, and Via-6 can form a group (e.g. the group can exclude intervening layers Metal-3, Metal-5). A zone of layers is a group of layers with no gaps.

The term "mill" refers to a material removal or etching process over a path that is guided by movement or scanning of a milling tool, relative to a sample being milled, over that path. Thus, etching with a focused ion beam (FIB) can be regarded as milling, while diffuse chemical etching may not be considered as milling. Because ion beam assisted chemical etching can be site specific at the location of the ion beam, it too can be regarded as milling.

The terms "monitoring signal" and "monitored signal" refer to a signal indicative of progress in a delayering procedure. The signal can be received from a sample being delayered, an apparatus with which delayering is being performed, or instrumentation coupled to the sample or the apparatus. A device coupled to receive or provide a monitoring signal is dubbed a "monitor." Non-limiting examples of monitoring signals include: electrical currents such as a body current measured from the sample, or a secondary current emitted or scattered from a surface of the sample; or image parameters such as brightness of an SEM image of the surface of the sample, or a measure of image contrast in the SEM image. Monitoring signals can include any explicit or derived image features (including an entire image) that are correlated to delayering depth.

The term "parameter" refers to a quantity that can have a specified value. While parameters often have numerical values, this is not a requirement. A parameter can have atomic values such as numerical, Boolean, or string; or more complex values organized as a data structure such as a list, a table, or a record. In the context of delayering, parameters can be classified as predetermined or dynamic. A "predetermined parameter" can have a value specified prior to commencement of a delayering procedure or an etching action, and whose value can remain unchanged for the duration of the delayering procedure or etching action. Examples of predetermined parameters can include beam voltage, layer count, or a coefficient for determining a threshold. A "dynamic parameter" can have a value which varies during the delayering procedure or etching action. Examples of dynamic parameters include an amplitude threshold or a width of an averaging window. Particularly, the value of a dynamic parameter can vary based on one or more monitoring signals observed during delayering or etching. A dynamic parameter can be initialized to the value of a predetermined parameter. A "set of parameters" denotes the parameters together with their associated values, so that two sets of parameters are distinct if a common parameter has different values in the two sets.

The term "period" refers to the spacing between successive instances of a reference point of an oscillatory waveform. An oscillatory waveform, such as a monitoring signal described herein, can have a reference point which recurs on each oscillation. The spacing, signal amplitude, and/or waveform shape of an oscillatory waveform can vary. Non-limiting examples of such reference points include a peak, a trough, a midpoint between peak and adjacent trough, or a zero-crossing. For a delayering procedure, the period can be measured in units of time, distance (e.g. depth), number of sweeps of an etching beam, or another parameter.

The terms "prior" and "preceding" refer to entities encountered on an earlier layer than an instant entity in a delayering procedure. To illustrate, layers Metal-1 and Via-2 precede Metal-3, and similarly inflections (or endpoints) Peak-1 and Trough-2 are prior to Peak-3. Particularly, prior, preceding, and similar terms exclude the instant entity, so that a candidate peak for the Metal-3 layer does not precede a later candidate peak for Metal-3.

The term "region of interest" (ROI) refers to a portion of a sample device to be examined. In the disclosed technologies, the ROI can be examined by a delayering process, where material is removed starting at a top surface, down through successive layers of the sample device. An ROI can be shown as an area on a surface of the sample device, and can extend below the surface to some depth. Commonly, the depth can be less (often, significantly less) than a transverse extent of the ROI, however this is not a requirement: in some examples an ROI can have small transverse extent in at least one transverse direction, with larger depth. An ROI can be shown as an area on an exposed layer of the sample after some delayering, and can be limited to the depth or thickness of the exposed layer, or can be limited to the surface of the exposed layer. The term ROI does not refer to any human interest.

The terms "retrospective" and "retrospection" refers to acts performed on or for prior entities. For example, a prior peak can be retrospectively analyzed based on updated parameters, and characterization of such peak can be retrospectively revised. To illustrate, a prior peak identified as endpoint of layer Metal-2 can be re-characterized as a disregarded peak, or a previously disregarded trough can be re-characterized as the endpoint of layer Via-2. Notably, changing an endpoint identified with a current layer is not retrospective. To illustrate, while searching for Metal-2, a peak Pi may be encountered as a candidate endpoint for the Metal-2 layer. Subsequently, the waveform may descend sufficiently that peak Pi can be confirmed as locating Metal-2. Alternatively, the waveform may continue to rise indicating that a subsequent peak Pj will be identified as Metal-2 and that peak Pi can be disregarded. Neither such confirmation nor such disregarding pertains to a prior layer, and these are not retrospective acts.

A "sample" or "sample device" is an article to be processed according to the disclosed technologies. Common samples are multilayer electronic structures, such as semiconductor logic devices. Many other microelectronic devices, electro-optical devices, or photonic devices can also be processed as described herein. Still further, certain examples of the disclosed technology can be applied to mineral samples, biological samples, chemical samples, or forensic samples.

The term "scanning electron microscope" (SEM) refers to an instrument combining an electron beam with controls to scan the electron beam in one or more transverse directions (or over a sequence of locations within a field of view) to perform imaging or some other analytic function on a sample.

The term "state machine" refers to a device maintaining a current state of a system or procedure, and changing the current state among multiple discrete states according to predetermined rules. State changes are dubbed "transitions". A state machine can be described using a "state diagram" showing states and transitions. In some disclosed examples, the device can be a computer programmed to perform an endpoint detection procedure and the current and available states can be the states of the endpoint detection procedure, for example "Find Peak" or "Found Trough".

The term "suspend" refers to temporarily or permanently stopping a procedure such as a delayering procedure. The term "pause" refers to a temporary stoppage. For example, delayering can be paused at an endpoint in order to perform an analytic procedure, and resumed thereafter. The term "halt" refers to a permanent stoppage. For example, delayering can be halted when no further delayering is required.

The term "target layer" refers to a layer of a sample at which a control action of a delayering procedure can be triggered. For example, delayering can be suspended to perform an analytic procedure on the target layer. As another example, beam etch parameters or endpoint detection can be changed upon reaching the target layer.

The term "waveform parameter" refers to any parameter characterizing an oscillatory signal. The signal and its oscillations can be characterized temporally (e.g. elapsed time in a delayering procedure), spatially (e.g. nanometers of depth in a delayered sample), or in units of sampling intervals. Non-limiting examples of waveform parameters include period (e.g. spacing between two peaks or other like points), half-period (e.g. spacing between a peak and a neighboring trough, or other complementary points), amplitude (e.g. excursion between a peak and its neighboring trough), rise time, or fall time. Waveform parameters can be local (e.g. for a particular peak or pair of inflections) or average (including median, mean, moving average, or weighted average) over all or part of the waveform.

The term "working surface" refers to an evolving active surface on which process operations are performed. The working surface can be at or within a layer dubbed the "working layer." For example, in a delayering process, the working surface can descend through a sample as material is removed. Conversely, in a coating or epitaxial growth process, the working surface can rise above an original surface as material is added.

The terms "top," "bottom," "up," "down," "above," "below" and the like are used for convenience, with respect to a common configuration in which a top surface of a sample is processed, e.g. by ion milling, downward to increasing depths. One of ordinary skill will understand from this disclosure that a choice of actual orientation can be varied without departing from the scope of the disclosed technologies.

Overview

Delayering of semiconductor devices plays an important role in process characterization and maintenance. It is often desirable to etch a device up to an endpoint at a particular layer and perform analysis or metrology at that layer. However, prior attempts to detect endpoints can require trial runs and manual configuration of endpoint detection parameters. Sometimes, spurious features can be identified as endpoints, or endpoints can be missed, which can lead to mis-identification of layers and inappropriate analyses.

The disclosed technologies employ retrospection to improve automatic layer identification during delayering. As delayering proceeds, measured signal amplitudes and periods can be used to re-evaluate the history of a monitoring signal. As an illustration, a peak of amplitude 10 can initially be qualified as an endpoint (e.g. based on an amplitude threshold of 5), but can be removed later when the monitoring signal reveals 15 as an appropriate amplitude threshold. As another example, if the monitoring signal reveals a period of 30 s, and two consecutive peak endpoints are 90 s apart, then intervening peaks and troughs at the appropriate times can be confirmed as endpoints through retrospective evaluation, in order to maintain periodicity of the identified layers. Illustratively, these intervening peaks and troughs may have been disregarded initially as having failed to meet an amplitude threshold. With improved retrospective endpoint determination, current and future endpoints can be correctly assigned to layers, which improves on prior approaches.

A delayering plan can specify layers at which analysis is required. Delayering can be controlled by a combination of predetermined and adaptive parameters. The predetermined parameters can include parameters for controlling the etching action (in examples, beam etch parameters), or other parameters for controlling an endpoint detection procedure (in examples, adaptive or retrospective endpoint detection parameters). Detected endpoints can be used to pause the etching for layer analysis; to select a different set of predetermined parameters for a subsequent layer; or to monitor the progress of delayering down through the device. The predetermined parameters can be obtained from libraries of parameters, organized by device types, process, and so forth; or can be determined empirically by one or more trial delayering procedures executed on a test device.

An adaptive endpoint detection technique can respond to variations in a monitoring signal over the course of delayering multiple device layers. That is, dynamic variation of the signal (e.g. varying parameters such as amplitude, period, rise time, fall time, or characteristics of particular waveform features) can lead to dynamic variation of thresholds or target conditions at which the technique identifies an endpoint. However, these thresholds or target conditions can also be dependent on predetermined parameters as described further herein. It can also be advantageous to control the etching action (e.g. by setting the beam voltage to a predetermined value) with additional predetermined parameters. Particularly, the predetermined parameters can be varied between groups of layers (e.g. different parameters for a first zone having thick metal layers, and for a second zone having thin metal layers) or between individual layers, even between two layers of a given type (e.g. two metal layers).

First Example Method

FIG. 1 is a flowchart 100 of a first automated method for delayering successive layers of a sample. A variation of the method, which integrates analysis into the process flow, is indicated with dashed lines.

At process block 110, a current working layer can be delayered. As an illustration, the current working layer can be the third metal layer (Metal-5) counting from the top of a semiconductor device sample. Within process block 110, the delayering can be controlled by predetermined parameters, as indicated by block 120. Delayering can be performed by etching with a raster scanned FIB or by any other techniques as described herein. Concurrently, a target endpoint can be detected at process block 130, using adaptive and retrospective endpoint detection as described herein. The detecting can occur at the time when it is determined that the endpoint has been reached, while adaptive endpoint detection can operate before, during, and after this time. The predetermined parameters can include parameters associated with an etching action (e.g. beam voltage, beam current, focus diameter of the beam, an area over which etching is performed, a dwell time for holding the beam steady at a given point within the etching area, a scan speed of an etching beam across a working surface of the sample, or a rastering pitch indicating a transverse distance between neighboring dwell locations), or can include parameters associated with adaptive endpoint detection (e.g. a multiplicative coefficient to set a threshold for endpoint detection).

Upon detection of the endpoint, the method can continue to decision block 150, where a determination is made whether any further layers are to be delayered. If not, the method follows the N branch from block 150 to termination block 190, and the method can be complete. However, if additional layers remain to be delayered, the method can proceed via the Y branch to block 160, where the layer is incremented (with count increasing going down into the sample), and then returns to block 110 to delayer the next layer, which could be the third via layer (Via-6), now the current layer.

While successive layers are delayered using predetermined parameters, the predetermined parameters can be varied between layers. In some examples, a first zone having thick layers (e.g. thick metal or thick via layers) can be delayered using a first set of predetermined parameters, while a second zone having thin layers (e.g. thin metal or thin via layers) can be delayered using a second set of predetermined parameters, having at least one predetermined parameter different from the first set. In further examples, first and second layers of a given layer type (e.g. both metal layers) can be delayered with distinct sets of controlling predetermined parameters. The first layer can be a thick metal layer in the first zone and the second layer can be a thin metal layer in the second zone. In additional examples, adjacent layers of different types (e.g. a metal layer and an adjacent via layer) can be delayered with different parameters. In still further examples, one or more of the predetermined parameters can be gradually varied over a continuous range of delayered layers, such that no two of the delayered layers are controlled by exactly the same predetermined parameters.

In some examples, analysis can be incorporated into the method of FIG. 1 at prescribed endpoints. To illustrate, one or more analysis operations can be triggered at every metal layer; at a number of desired layers, such as Via-6, Metal-7, and Via-8; or at the Active layer of a sample semiconductor device. Turning to the dashed lines in flowchart 100, when an endpoint is detected at block 130, the method variation follows a dashed line to decision block 142 instead of going directly to decision block 150. At block 142, a determination can be made whether the current endpoint is flagged for any analysis procedure. If not, the method follows the N branch from block 142 to block 150, and proceeds as described above. However, if an analysis procedure is specified, the method follows the Y branch to process block 144, where the analysis procedure can be triggered. The trigger signal 173 can be directed to analyzer 170 as indicated, and the method can proceed to block 146 to wait for analysis to complete. When analysis is complete, the analyzer 170 can indicate completion via signal 177, which completes the wait at block 146, allowing the method to proceed to decision block 150 as indicated by dashed lines, to continue as described herein. In variations, more than one analyzer 170 can perform more than one analyses on the sample, or different analyses can be performed on different layers of the sample, i.e. at different endpoints of the delayering procedure.

Example Apparatus

Figure 2:
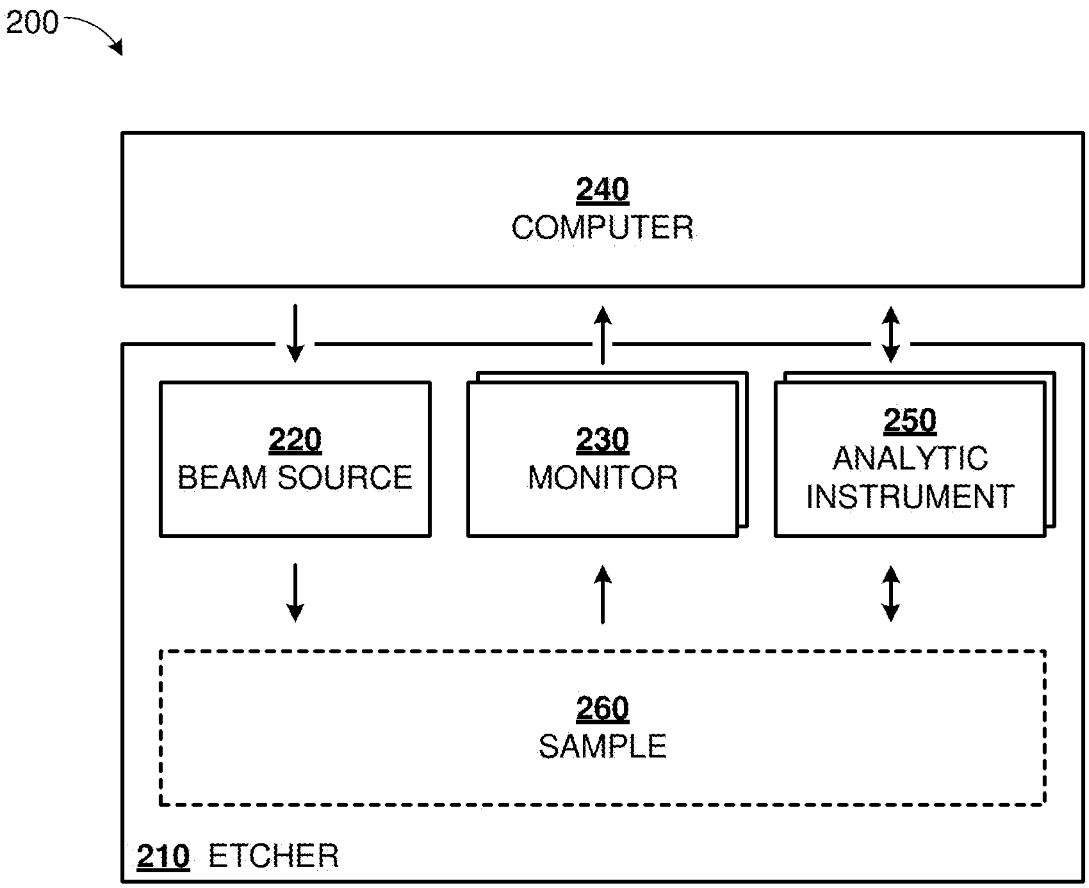
FIG. 2 illustrates an example apparatus according to the disclosed technologies.

FIG. 2 illustrates an example apparatus 200, including an etcher 210 coupled to a computer 240. The apparatus 200 can perform delayering or analysis operations on a sample 260, which can be placed within or proximate to the etcher 210, but which is not part of the apparatus 200. Apparatus 200 or a similar apparatus can perform any one or more of the methods described herein.

In some examples, etcher 210 can include a beam source 220, such as a FIB source, to generate a beam for etching the sample 260. The etching operations can be milling or delayering operations. The beam source 220 can be controlled by the computer 240 as indicated. In other examples, the beam source 220 can generate an electron beam or a laser beam. In further examples, another etching technology can be used, and a different source of etchant or etch energy can be used in place of, or in addition to, beam source 220.

An etching action can be monitored by a monitor 230, which can be a current detector, an imager, or other diagnostic instrumentation. The current can be substrate current measured from sample 260, or scattered or secondary charged particles emitted from the surface of sample 260. An imager can form an image from scattered or secondary charged particles during a raster scan of a milling beam, or with a scanning electron microscope, or with an optical camera (which can operate in the ultraviolet, visible, or infrared portions of the electromagnetic spectrum). In other examples, monitor 230 can measure: gas constituents in an environment above the sample; acoustic emission; or reflected light from a surface of sample 260. In varying examples, the monitor 230 can be configured to acquire a monitoring signal during an etching action; during a pause after an etching action; or in between etching actions. Etcher 210 can include multiple monitors 230, which can employ same or different measurement techniques (e.g. one imager and one current sensor) at different spatial locations (e.g. different sites or different depths).

In some examples, etcher 210 can include one or more analytic instruments 250 for performing analysis on the sample 260. Analytic instruments 250 can include a SEM or an optical camera, however other analytic instruments such as nanoprobers can also be incorporated into etcher 210. In other examples, analytic instruments can be provided as an adjunct to the etcher 210, and can be controlled by computer 240, or independently. Some analytic instruments 250 can be operational during an etching action, while other instruments 250 can be operated after completion of an etching action or in between etching actions.

Second Example Method

Figure 3:
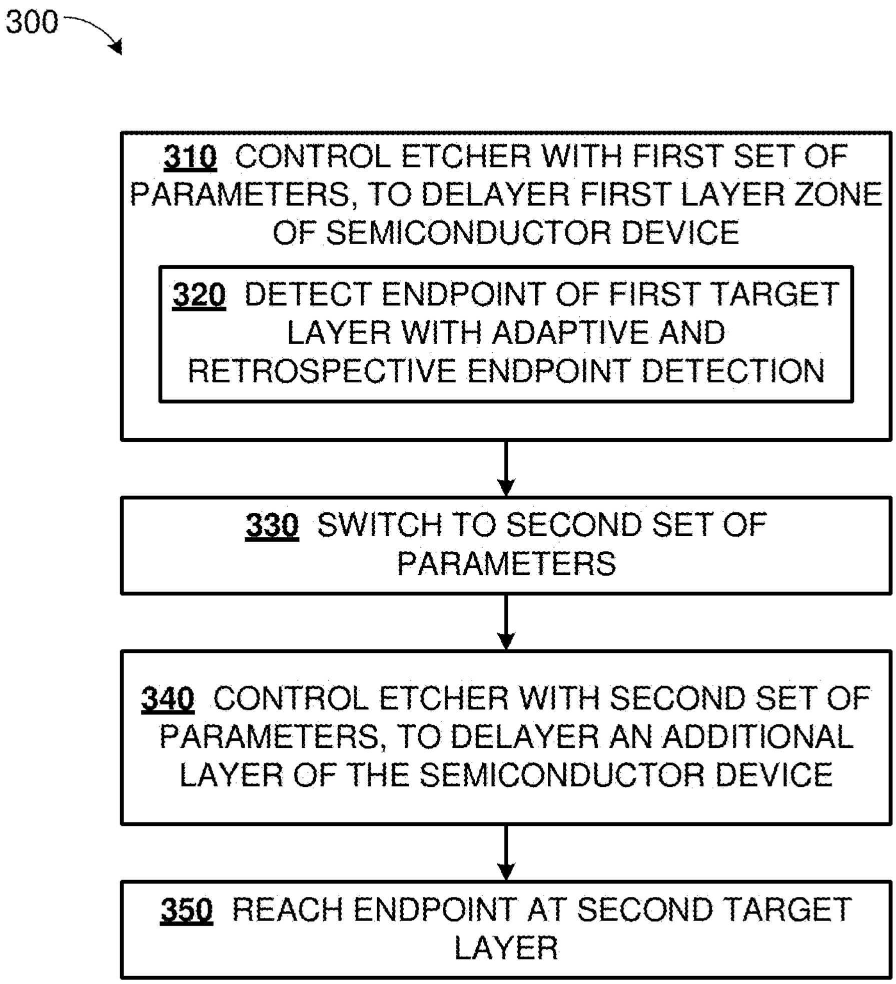
FIG. 3 is a flowchart of a second example method for delayering zones of a semiconductor device, according to the disclosed technologies.

FIG. 3 is a flowchart 300 of a second example method for delayering zones of a semiconductor device. In this method, a set of predetermined parameters is changed after delayering a first zone.

At process block 310, an etcher can be controlled with a first set of predetermined parameters to delayer a first layer zone of a semiconductor device. Within block 310, adaptive and retrospective endpoint detection can be used at block 320 to detect the endpoint of a first target layer within the first layer zone. After completion of block 310, the method advances to block 330, where the first set of predetermined parameters can be replaced by a second set of predetermined parameters, having at least one or more parameters distinct from the first set of predetermined parameters. In some examples, the distinct parameter can be an adaptive endpoint detection parameter, while in further examples, the distinct parameter can be a beam etch parameter. At process block 340, the etcher can be controlled with the second set of predetermined parameters to etch at least one additional layer of the semiconductor device. For example, the etcher can be controlled to reach an endpoint of a second target layer at process block 350.

An error in identifying the first target layer can lead to incorrect parameters being used between the incorrect and actual target layer locations, which can compound errors overall. Advantageously, retrospection can improve reliability of locating the first target layer, thereby improving the reliability of locating the second target layer as well.

Third Example Method

Figure 4:
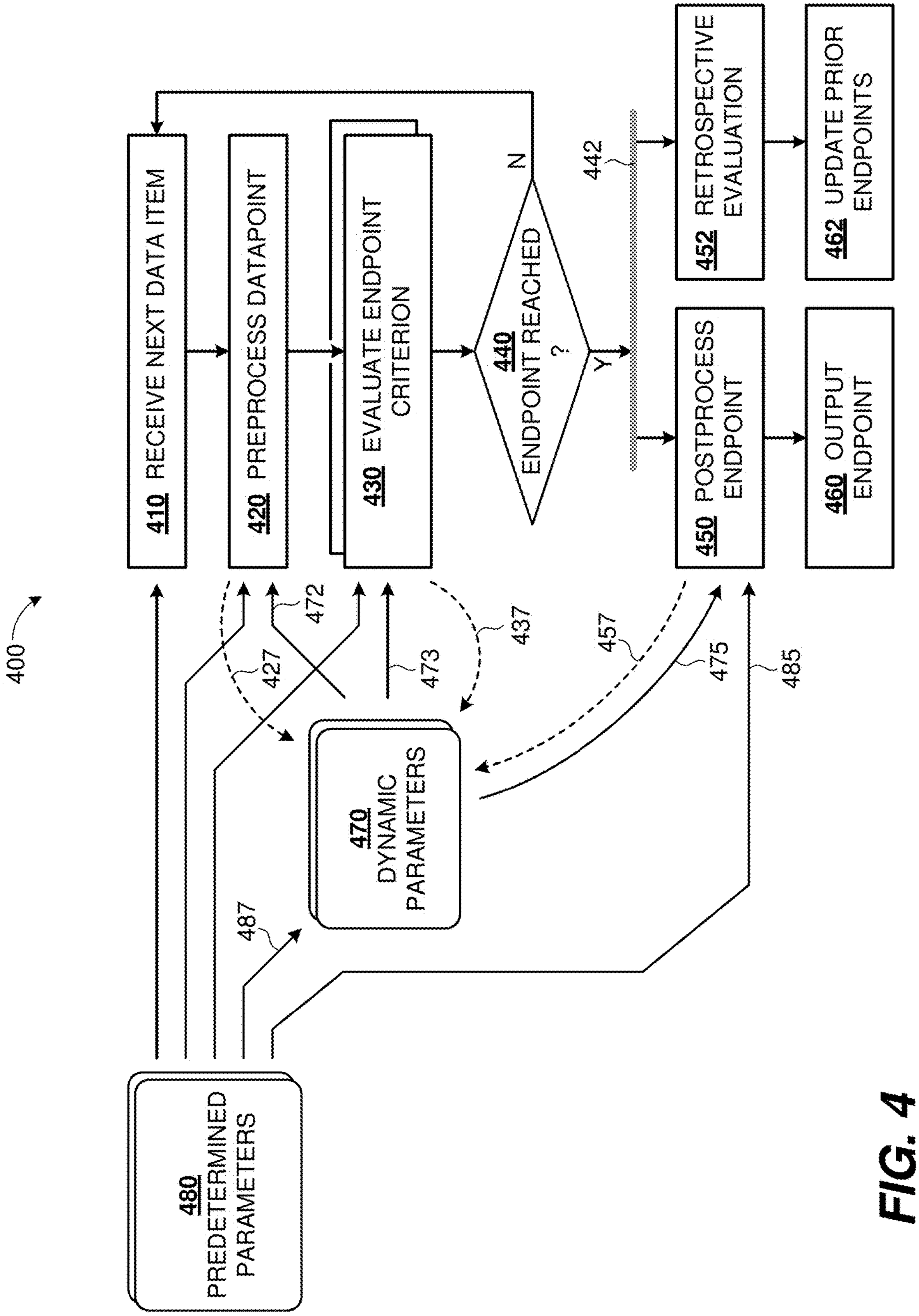
FIG. 4 is a flowchart of a third example method, for adaptive and retrospective endpoint detection according to the disclosed technologies.

FIG. 4 is a flowchart 400 of an example method for adaptive and retrospective endpoint detection. This method uses a combination of predetermined parameters 480 and dynamic parameters 470 to determine an endpoint from a sequence of datapoints. Solid line arrows indicate exemplary pathways for the parameters 470, 480 to control the operations of the method, while dashed line arrows indicate exemplary pathways whereby dynamic parameters can be adjusted from the various process blocks. As indicated by arrow 487, dynamic parameters 470 can also receive initialization values from the predetermined parameters 480. Because a predetermined parameter 480 can remain unchanged during a delayering procedure, FIG. 4 has no arrows leading to the predetermined parameters 480.

At process block 410, a next data item can be received. The new data item can correspond to a monitoring signal and can be a scalar quantity, such as a current measurement or an image grayscale value, or a more complex item such as an entire image frame. The rate of acquiring datapoints can be controlled by a predetermined parameter 480.

At process block 420, the new data item can be preprocessed. Preprocessing operations can include validation, filtering, or scaling. Preprocessing can also include extraction of an image parameter from image data received at block 410. Any of these preprocessing operations can be controlled by respective predetermined parameters 480. However in some examples, preprocessing can also depend on a dynamic parameter 470 as shown by arrow 472. For example, a filter time constant can be controlled dynamically based on the amount of noise observed in a monitoring signal (data item). Additionally, the preprocessing can cause adjustment of one or more dynamic parameters, as indicated by arrow 427. For example, preprocessing block 420 can update the standard deviation or noise of a monitoring signal, which can be a dynamic parameter 470, or which can control a filter coefficient or another dynamic parameter 470.

At process block 430, one or more endpoint criteria can be evaluated. Evaluation of an endpoint criterion can be dependent on both predetermined parameters 480 and dynamic parameters 470 (the latter indicated by arrow 473), as described further herein. Further, the method can include multiple endpoint criteria, and selection of which criterion to evaluate can be dependent on predetermined parameters (e.g. different criteria for current or image grayscale monitoring signals) or dynamic parameters (e.g. different criteria if the next sought endpoint is a Peak or a Trough). Additionally, evaluation of endpoint criteria can feed back to update dynamic parameters as indicated by arrow 437. For example, identification of a higher Peak than a prior Peak endpoint can cause a baseline for Trough detection to be updated, as described further herein in the context of FIG. 8B. Examples of peaks 911-914 and troughs 921-924 are provided in FIG. 9.

At branch block 440, the method proceeds according to whether block 430 resulted in identification of an endpoint. If no endpoint was found, the method can proceed via the N branch of block 440 to block 410 to acquire the next data item. However, if an endpoint was reached, the method can follow the Y branch via fork 442 to one or both of blocks 450, 452. At block 450, postprocessing can be performed based on the endpoint. Postprocessing can include performance of analytic tasks at specific layers, as indicated by predetermined parameters 480 of a delayering plan, as described further in context of FIG. 6B herein. Postprocessing can also include calculation or update of delayering milestones based on reached endpoints, which can in turn cause update of dynamic parameters 470 as indicated by arrow 457. For example, a sequence of time markers of successive endpoints can be used to predict a time at which a next endpoint can be expected. The predicted time can be one of the dynamic parameters 470. As another example, the monitoring signal amplitude of the current endpoint can be used to set a threshold value for the next endpoint.

At process block 460, one or more values associated with the current endpoint can be outputted. Endpoint values can variously be outputted to a memory buffer, to a stored file, or returned to a supervisory method. In varying examples, the returned values of the endpoint can include an index of the current endpoint (e.g. "4" for the fourth endpoint of a delayering procedure), a layer of the current endpoint (e.g. "Metal-3"), a value of the monitoring signal at this endpoint, a time position or a depth estimate for the current endpoint, a tolerance indicating a range of time or distance between the actual layer endpoint and the identified endpoint, or a confidence level indicating a likelihood that the determined endpoint is accurate to within a predetermined tolerance.

Turning to block 452, retrospective evaluation can be performed to review prior endpoints or candidates. The review can take into account updated information of e.g. amplitude or periodicity. Following review, one or more prior endpoints can be updated at block 462. For example, endpoints can be added at previously disregarded peaks or troughs, endpoints can be reclassified as disregarded peaks or troughs, or layer identification of a given endpoint can be corrected. In some examples, a given peak or trough can be reclassified more than once while, in other examples, a given peak or trough can only be reclassified once.

Blocks 450, 452 can utilize predetermined parameters 480 and dynamic parameters 470 as indicated by respective arrows 485, 475; and can also update dynamic parameters 470 as indicated by arrow 457. For example, postprocessing at block 450 can update dynamic parameters 470 for peak-to-trough amplitude, associated thresholds, period, or signal mean value, while retrospective evaluation at block 452 can utilize these or other updated parameters 470. Additionally, block 452 can update a current layer index, which can also be maintained as a dynamic parameter 470. Retrospective evaluation 452 can also utilize predetermined information 480 about a layer plan. As an illustration, some devices can have upper layers spaced farther apart than lower layers. If the transition is known to occur at Metal-7, say, then misapplication of period information below Metal-7 (e.g. from Via-8, Metal-9, etc.) to recharacterization above Metal-7 (e.g. for Metal-3, Via-4, etc.) can be avoided. In variations, retrospective analysis can also incorporate layer information gleaned from sample analyses performed during the delayering procedure (e.g. at block 144 of FIG. 1).

In further variations, the two branches of branch 440 can be performed as sequential operations, e.g. 450→452→462→460, whereby a current endpoint is outputted taking account of any changes to prior endpoints. In other embodiments, a current endpoint can be stored at block 460 first, and subsequently re-evaluated if changes are made in the retrospective evaluation. Particularly, retrospective evaluation can change the status of the current endpoint. In varying instances, the current endpoint can be changed to a disregarded inflection, block 460 can be conditionally skipped, or the current endpoint can be deleted from a memory buffer.

The illustrated pathways between dynamic parameters 470 and the process blocks of FIG. 4 are exemplary. Other embodiments can have more, fewer, or different pathways than those illustrated.

Fourth Example Method

Figure 5:
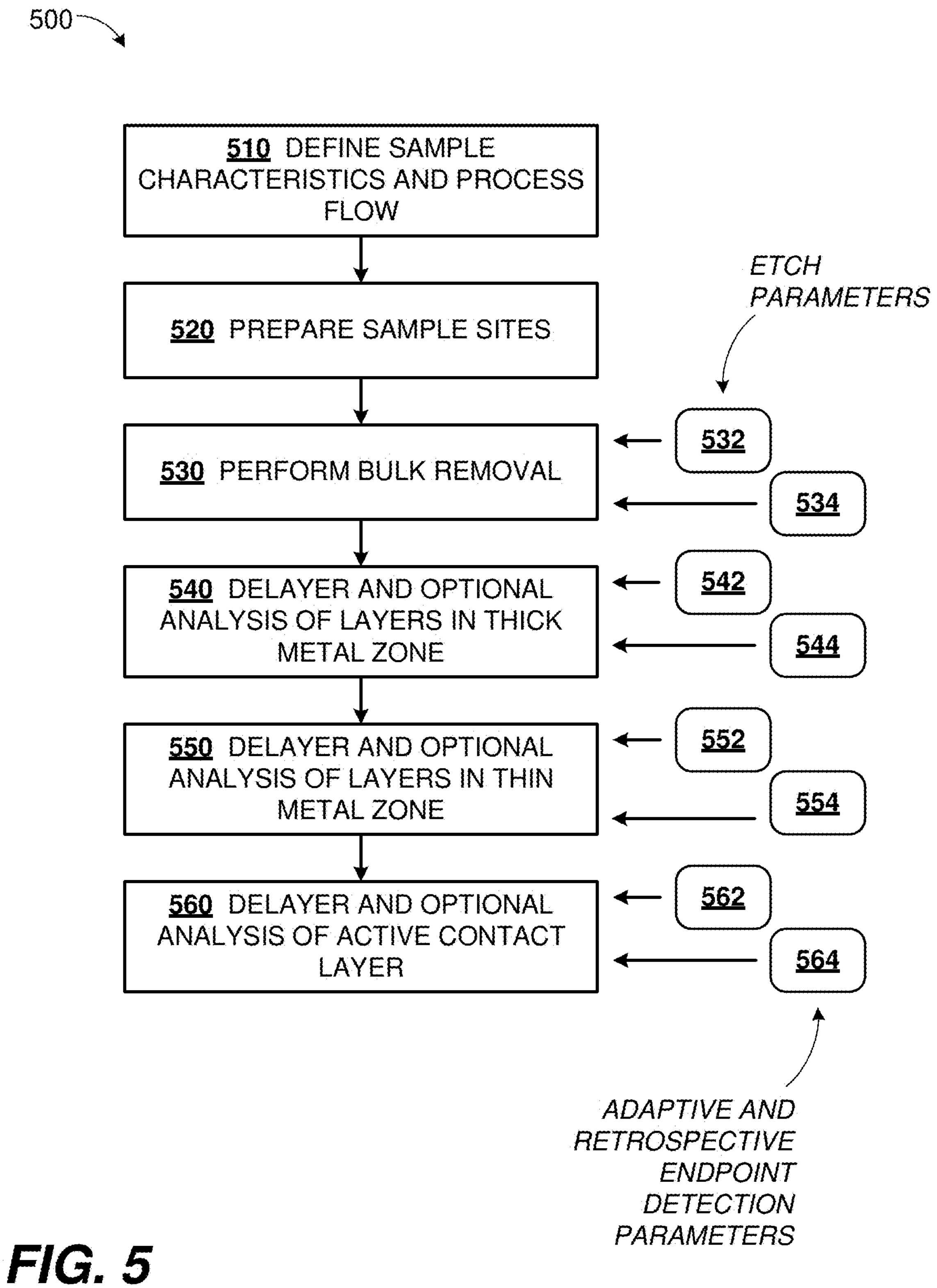
FIG. 5 is a flowchart of a fourth example method for delayering zones of a sample, according to the disclosed technologies.

FIG. 5 is a flowchart 500 of a fourth example method for delayering zones of a sample. This method includes actions performed before and during a delayering procedure.

Figures 6A, 6B:
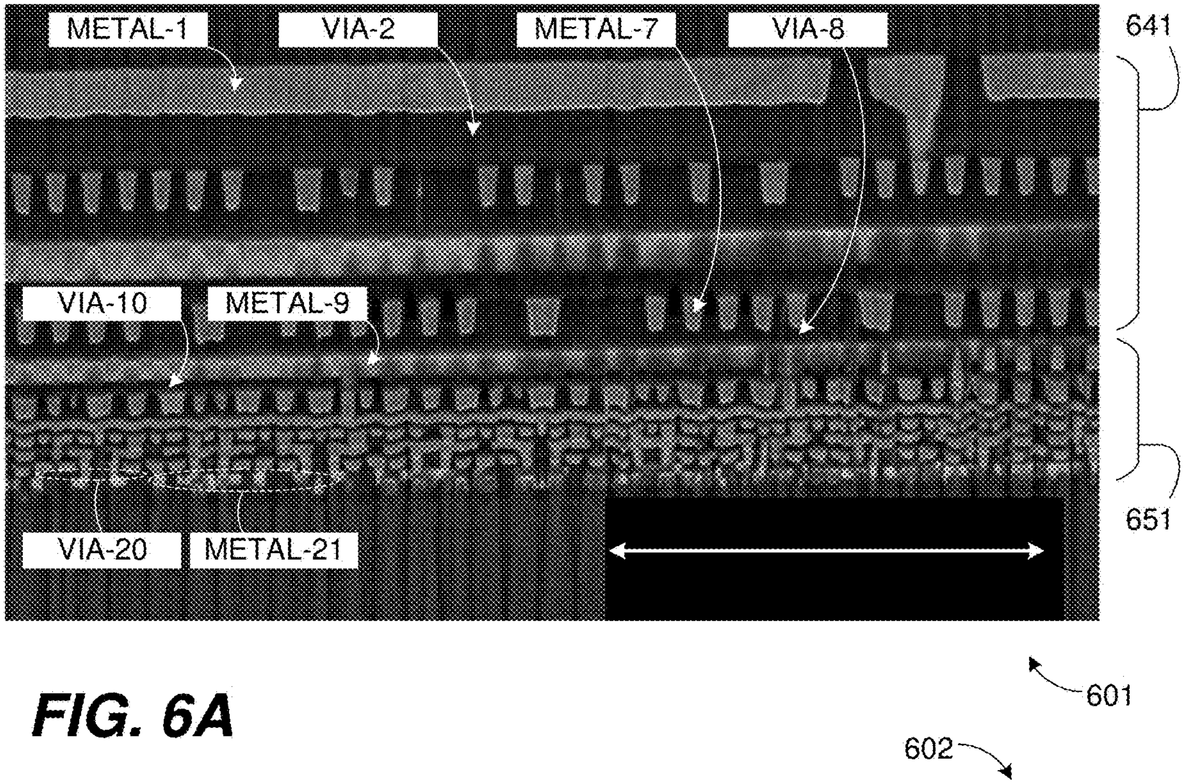
FIG. 6A is a photomicrograph of a cross-section of a sample semiconductor device.
FIG. 6B is a table of example configuration parameters for delayering the sample of FIG. 6A.

At process block 510, sample characteristics and process flow can be defined. FIGS. 6A-6B provide an illustration. FIG. 6A is a SEM microphotograph 601 of a cross-section of a sample semiconductor device. As indicated by the legend, this image was obtained on a dual beam microscope, which combines a PFIB source with an SEM. The image 601 shows metal as a light gray shade against a dark gray background for insulating material. Counting from the top, zone 641 includes the uppermost four metal layers, Metal-1 through Metal-7 and intervening layers Via-2 through Via-6. Zone 651 includes the remaining metal layers Metal-9 through Metal-21, intervening layers Via-through Via-20, as well as layer Via-8 between Metal-7 and Metal-9. In this illustration, layers Metal-1 through Metal-7 have thickness on the order of 100 nm, or in a range 50 nm to 500 nm inclusive, and can be termed "thick" metal layers, while layers Metal-9 through Metal-21 have thickness on the order of 20 nm, or in a range 5 nm to 50 nm, and can be termed "thin" metal layers. These thicknesses are merely illustrative, as layer metal thicknesses can vary considerably between products, product classes, and processes.

FIG. 6B is a table 602 of example configuration parameters for the sample of FIG. 6A, organized as blocks 0-3. Sample characteristics are provided at block 0 "Sample Information," including the stack height of 11 metal layers and the number of thick metal layers as four (Metal-1, -3, -5, -7 in zone 641). Site information is provided at block 1. To illustrate, the 4$^{th}$ site in an arithmetic and logic unit of a processor device can be named "ALU_04," and a storage folder for configuration, monitoring, or analysis data at this site can be provided as "C:\SAMPLE\". Block 2 can provide various user options for the delayering procedure. Item 2.1, "METAL_METAL," indicates a particular process flow for delayering layers in pairs, each pair being a metal layer followed by a via layer, with optional pauses when each metal layer is reached for imaging analysis. Items 2.2 and 2.3 prescribe a range of layers at which the analysis (imaging) is to be performed, which are metal layers Metal-5 through Metal-11 in this illustration. Item 2.4 indicates that delayering down to the active contact layer is desired. The milling area 50 μm×50 μm is specified in item 2.5. Finally, item 2.6 indicates that no polishing is to be performed at the imaging endpoints. Polishing can be optionally performed as a preparation for analysis with a probe, using sputtering with a bare beam, e.g. a FIB unassisted by etching gas chemistry. At block 3, item 3.1 indicates that a recovery flag is false. A recovery flag can be set to true to indicate that a site is being reprocessed, e.g. to recover and resume delayering or analysis after failure of a prior procedure at the site.

Returning to flowchart 500, with sample characterized and process flow defined, the method proceeds to block 520. One or more sites can be prepared on the sample. Fiducials can be applied on a surface of the sample device to demarcate etching sites. In some examples, the prepared sample can be installed in the etcher. In an etching apparatus using a translation stage to position successive sites of the sample beneath the working area of an etching beam, the stage locations for one or more sites can be bookmarked to facilitate repositioning of the sample. The etcher can be activated for etching.

At process block 530, bulk removal can be performed, which can include removal of sealant or cap layers above the Metal-1 layer. In some examples, bulk removal can be performed within the same etcher as the delayering, while in other examples, the bulk removal can be performed in a wet etcher prior to placing the sample in the delayering etcher. Within the delayering etcher, bulk removal can also be used to remove any excess remaining surface materials and can also be used to delayer a continuous zone of thick and/or thin metal layers up to the starting layer (item 2.2 in table 602). Bulk removal can be controlled by beam or other etching parameters 532. An endpoint for the bulk removal can also be determined by adaptive endpoint detection, and can be controlled by corresponding predetermined parameters 534. In varying examples, the bulk removal process can end at a prescribed depth in the sample, which can be above layer Metal-1; when layer Metal-1 is reached; or when the starting layer is reached. In examples where the starting layer is in the (lower) thin metal zone 651, process block 530 can count off the layers and switch from thick to thin metal predetermined parameters when transitioning from zone 641 to zone 651.

At process block 540, delayering of a thick metal zone (such as zone 641) can be performed, controlled by etch parameters 542 and adaptive and retrospective endpoint detection parameters 544. At process block 550, delayering of a thin metal zone (such as zone 651) can be performed, controlled by etch parameters 552 and adaptive and retrospective endpoint detection parameters 554. Finally, at process block 560, delayering can continue from the end layer (stop point) indicated by (item 2.3 in table 602) until an endpoint indicating that the (top of) the active contact layer has been reached. In some examples, successive layers of a zone of layers can be removed continuously from the end layer (stop point) until the active contact layer is reached. This endpoint can be at a trough following the last metal layer, e.g. Via-22 after Metal-21, with reference to FIG. 6A. Process block 560 can be controlled by etch parameters 562 and adaptive endpoint detection parameters 564.

Any of the delayering blocks 530, 540, 550, 560 can be suspended at endpoints defined in the process flow at block 510. Following the illustration of FIG. 6B, imaging can be performed at layers Metal-5 and Metal-7 in zone 641, and at layers Metal-9 and Metal-11 in zone 651.

The etch parameters 532, 542, 552, or 562 can be obtained from a library, or can be determined experimentally from one or more trials on a test device. Similarly, adaptive or retrospective endpoint detection parameters 534, 544, 554, or 564 can be obtained from a library, or can be determined experimentally from one or more trials on a test device. The endpoint detection parameters 534, 544, 554, or 564 can include an initial setting of threshold (for monitoring signal amplitude above or below a baseline), thresholds for detection of peak and trough endpoints, or a time interval between successive monitoring signal data points.

Example Endpoint Detection Parameters

Figure 7B:
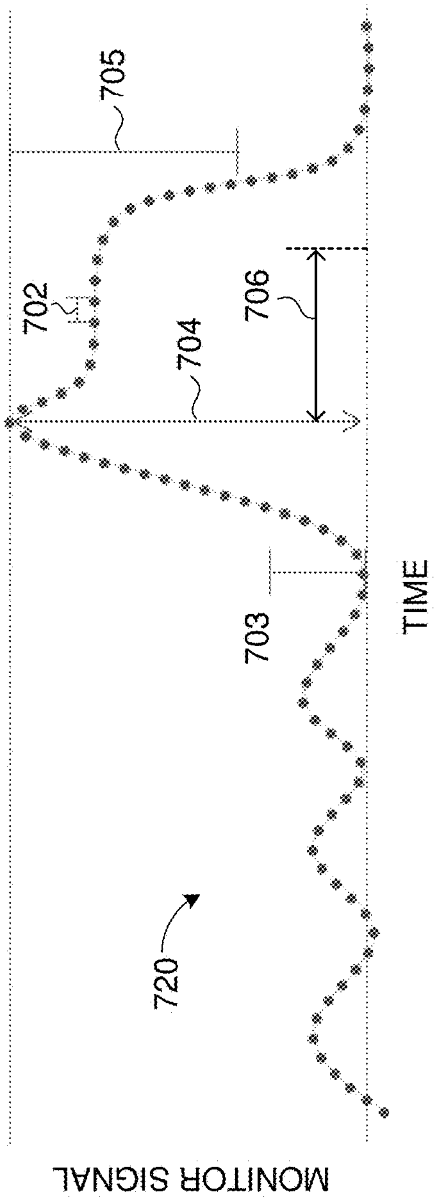
FIGS. 7A-7B illustrate example endpoint detection parameters, according to the disclosed technologies.
Figure 7A:
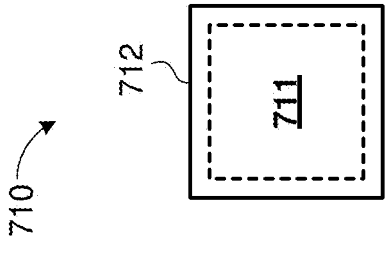

FIGS. 7A-7B illustrate example endpoint detection parameters. FIG. 7A shows a top view 710 of a milling area 712 on a top surface of a sample. Because of slant sides, it can be desirable to exclude edge portions of the milling area from an image intensity used as a monitoring signal. Thus, parameter extraction from the image can be restricted to the area 711 shown in dashed outline. That is, the image field (region of interest) used for evaluating a monitoring signal can be restricted as one or more predetermined parameters. In varying examples, this restricted image field can be specified as the area (e.g. in 1 $\mu m^2$) of area 711, as the dimensions (length×width) of area 711, as the width of the edge portions between the dashed outline of area 711 and the solid outline of milling area 712, or as a ratio of the area of 711 to the area of 712, which can be expressed as a fraction or as a percentage.

FIG. 7B depicts a graph 720 of an exemplary monitoring signal as a delayering procedure crosses a layer (e.g. a metal layer) having a peak in the monitoring signal. FIG. 7B illustrates features 702-705 associated with respective parameters. Feature 702 illustrates a time interval between datapoints used for adaptive endpoint detection. As described herein, the illustrated datapoints can be smoothed datapoints using a rolling average, and the actual sampling interval of the monitoring signal can be shorter than the interval 702. In varying examples, the interval 702 can be specified as a time (e.g. in seconds), or as a multiple of a raw sampling rate of the monitoring signal. In other examples, the sampling interval of the raw monitoring signal can be longer than interval 702, and interpolation (or, upsampling) can be used to obtain the illustrated datapoints.

Feature 703 indicates an amplitude that is greater than the signal fluctuations to the left of feature 703, and smaller than the actual peak amplitude observed. Feature 703 can be an initial threshold for determining a first peak or a first trough of a multi-layer delayering procedure. In some examples, the amplitude of feature 703 can be used as the threshold for detection of the first endpoint, while in other examples, the amplitude of feature 703 can be a seed for the adaptive endpoint detection procedure, subject to dynamic update (for example, as the noise level of the monitoring signal is discerned after several samples), so that the actual threshold at the time of first endpoint detection can differ from the initialization value 703. In further examples, trough and peak threshold amplitudes can be initialized to distinct values. Any such initialization value can be a predetermined parameter.

Feature 704 illustrates measurement of a signal peak above the level of a preceding signal trough. In some examples, an amplitude 704 above a threshold can cause a peak endpoint to be detected. Non-limiting examples of a peak detection threshold include: a multiple of the signal variation (i.e. standard deviation of some or all preceding samples); a multiple of a preceding peak amplitude (relative to a preceding or intervening trough); or a multiple of an average or median excursion between some or all prior peaks and adjacent troughs. Such a multiplier coefficient can be a predetermined parameter for adaptive endpoint detection.

Feature 705 illustrates a drop from a peak, which can be used to test a threshold for the following trough or to confirm preceding peak 704 as an endpoint. Similar to the peak detection threshold, the trough detection threshold can be specified as a multiple of: the preceding peak amplitude (relative to its preceding trough); the signal variation (i.e. standard deviation of some or all preceding samples); a preceding peak amplitude relative to an adjacent trough; or an average or median excursion between some or all prior peaks and adjacent troughs.

Feature 706 illustrates an endpoint spacing threshold, which can be used to reduce a risk of false positive endpoints too close to a preceding endpoint. As illustrated, a peak is detected at 704, and a subsequent endpoint can be required to be spaced apart from the peak at 704 by an amount corresponding to the arrow 706. In varying examples, the spacing 706 can be designated in units of time, such as few seconds or minutes, or in units of distance, such as nm or In examples, the time spacing can be in a range from 1 s-30 minutes ("min."). An endpoint detection procedure can be turned off after an endpoint is detected until the endpoint spacing threshold, measured from the last endpoint, has passed. This can be advantageous to avoid false triggers on a noisy monitor signal. The duration of such a spacing threshold can be in a range 1-30 s, or 2-20 s, or 5-15 s, or about 10 s. In other examples, the endpoint detection procedure can continue to operate, however a subsequent inflection can be determined not to meet endpoint criteria if its spacing to the previous endpoint is less than the endpoint spacing threshold. This can be advantageous to avoid false triggers from target devices having strong shoulders and deep secondary troughs. The duration of such a spacing threshold can be in a range 30 s-30 min., 1-10 min., 2-5 min., or about 3 min. Corresponding endpoint spacing thresholds can vary from 1 nm to 100 μm. In some layer stacks, the spacing threshold can be in a range 2-100 nm, 5-50 nm, 10-20 nm, or about 15 nm, while in bulk layer removal or other applications, spacing thresholds can be in a range 100 nm-100 μm, 1-50 μm, or 10-20 μm. The endpoint spacing threshold can be specific to particular endpoint types. For example, following a peak endpoint (e.g. Metal 5), a spacing threshold can be applied for a subsequent trough, while allowing detection of subsequent peaks, one of which could displace the first peak endpoint with a stronger second peak (still Metal 5) among a series of peaks. More than one endpoint spacing threshold can be used together. Any such endpoint spacing threshold can be a predetermined parameter or a dynamic parameter.

Additional predetermined and dynamic endpoint detection parameters are described in the Appendix.

The described features, predetermined parameters, and representations are illustrative. In varying examples, less, more, or different features or predetermined parameters can be used.

Additional Example Methods

Figure 8B:
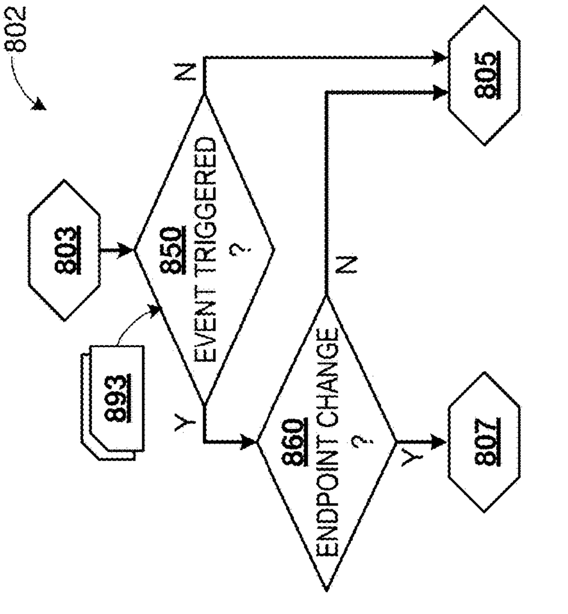
FIGS. 8A-8B are flowcharts of additional example methods for delayering a sample, according to the disclosed technologies.
Figure 8A:
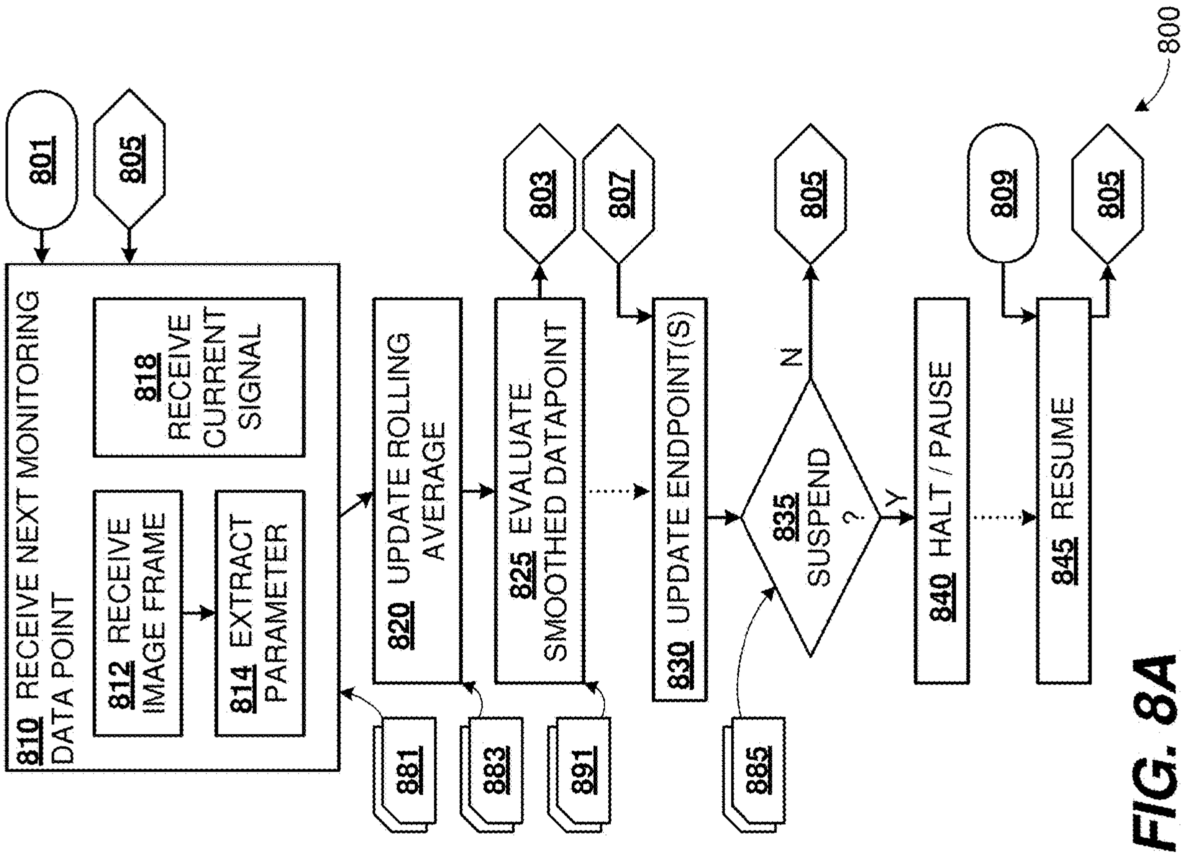
Figure 9A:
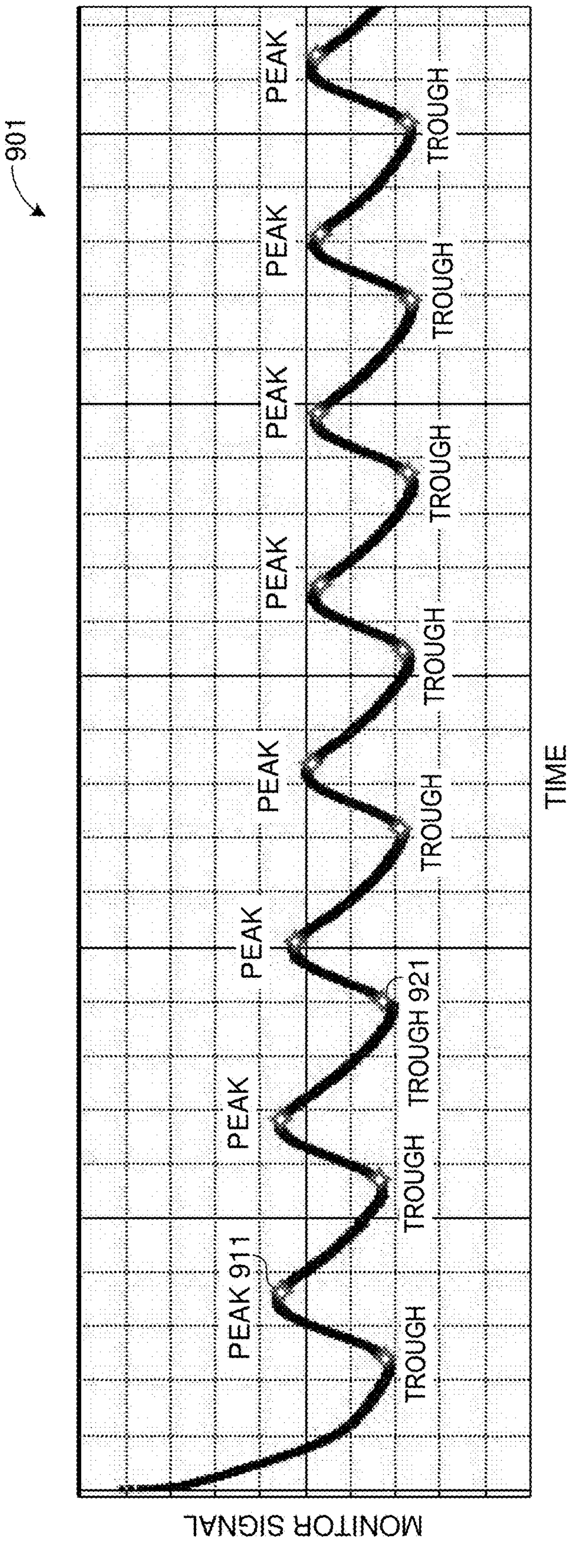
FIGS. 9A-9D are graphs of additional monitor signals which can be used in delayering according to some examples of the disclosed technologies.
Figure 9B:
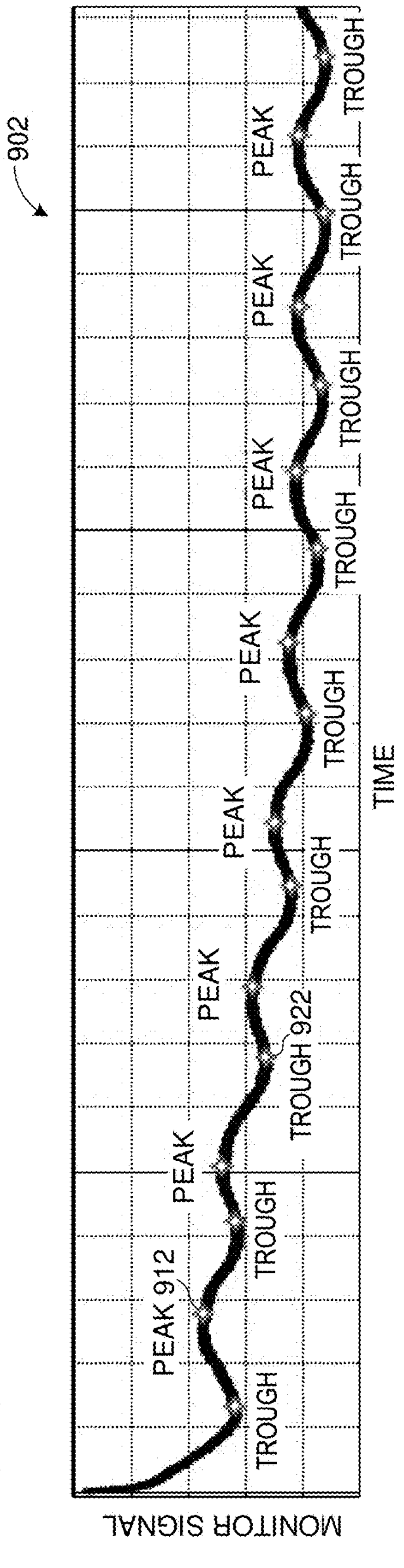
Figure 9C:
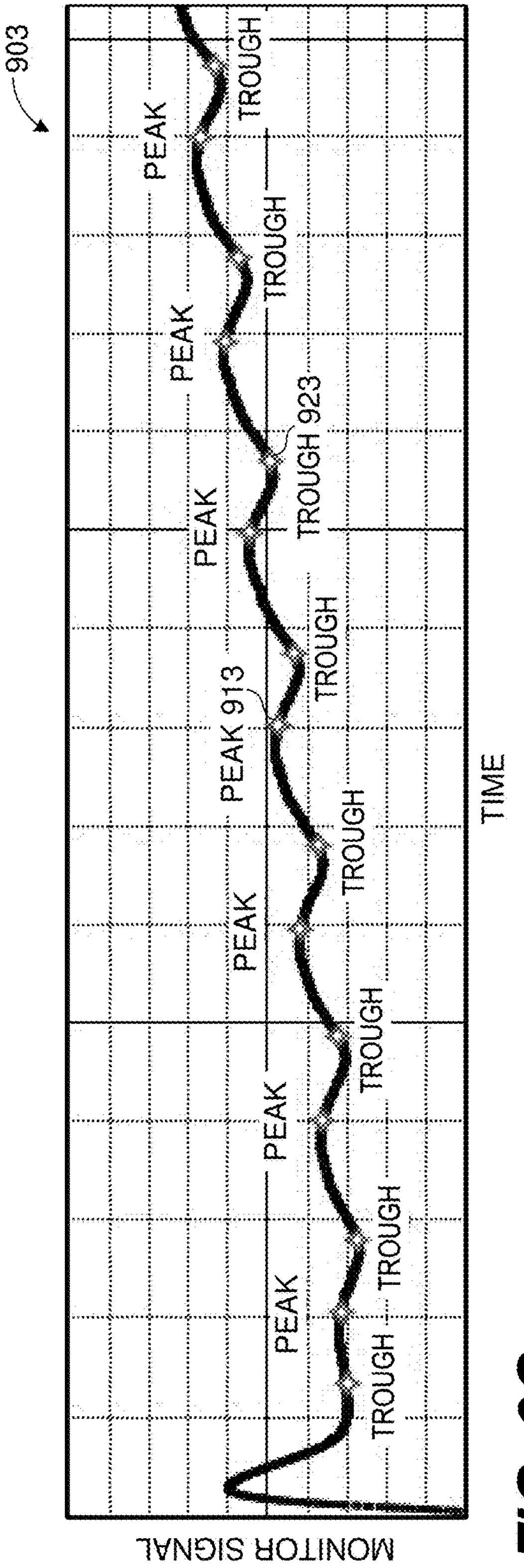
Figure 9D:
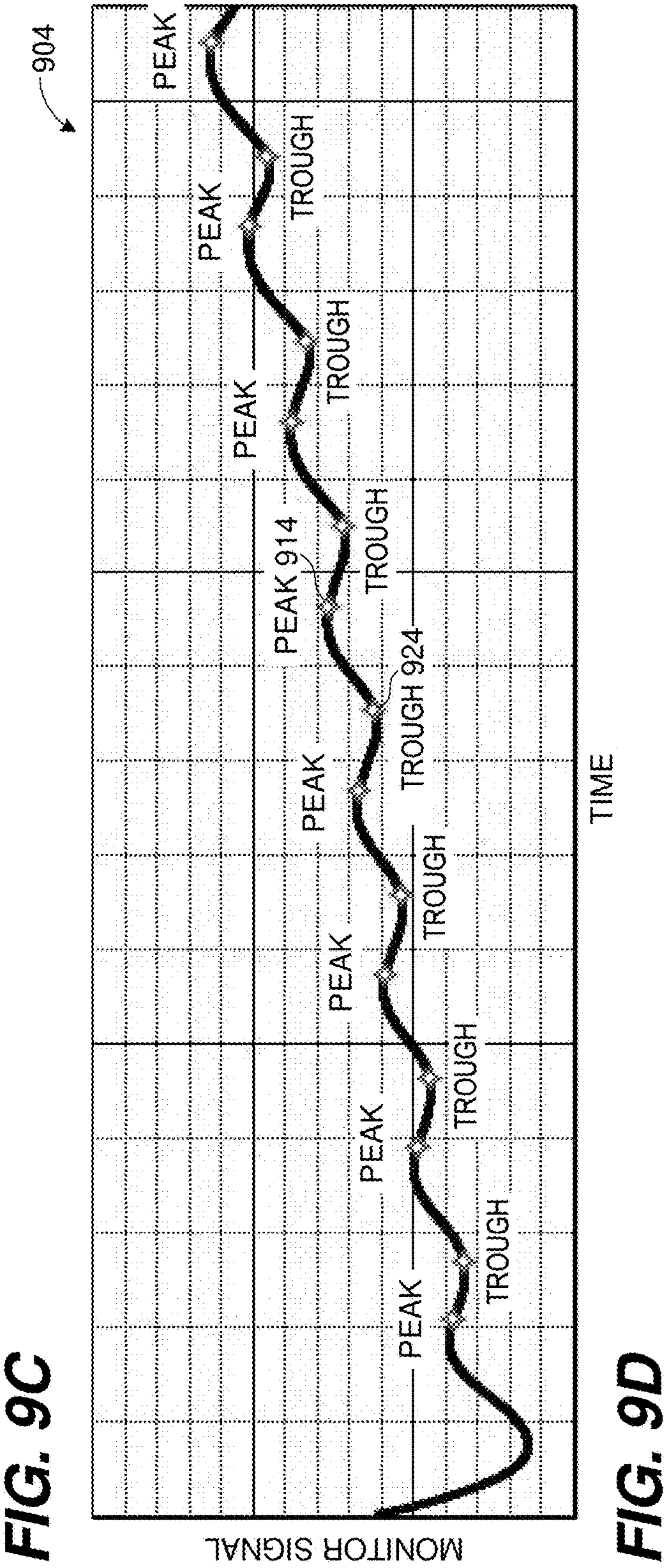

FIGS. 8A-8B are flowcharts 800, 802 of additional example methods for delayering zones of a sample, according to the disclosed technologies. FIG. 8A illustrates processing of monitoring signals and processing of endpoints, while FIG. 8B illustrates flow through an exemplary endpoint detection procedure. For convenience of description, the methods depicted in flowcharts 800, 802 are termed "method 800" and "method 802" respectively. Connectors, shown as hexagons, are used to represent paths leading to or from various process blocks.

Starting with FIG. 8A, a monitoring datapoint can be received at process block 810. In some examples, the monitoring signal is a current signal, and the monitoring datapoint can be the value of the current signal. That is, the current signal can be received at block 818. In other examples, the monitoring signal can be an image of the sample and the monitoring datapoint can be a parameter obtained from the image. At block 812, an image frame can be received, and at process block 814, a monitoring parameter can be extracted from the image frame. To illustrate, the monitoring parameter can be an average grayscale value over a region of interest within the image frame, however other parameters can also be used. Exemplary monitoring parameters can include: different percentiles of the grayscale distribution of an image area; variation or standard deviation of the grayscale values; a measure of true color or false color from the image area; a change in an image parameter from a preceding image frame; or other parameters. Gamma correction, transforms, or other image processing operations can be applied prior to calculating the monitoring parameter. Although FIG. 8A illustrates acquisition of a datapoint for current and image monitoring signals, these are only illustrative, and other monitoring signals can be used with the disclosed technologies. In further examples, more than one type of monitoring signal can be used simultaneously. Block 810 can be performed repeatedly, to obtain a sequence or monitoring signal values, such as a sequence of current readings or a sequence of image parameters. Detection of an endpoint downstream can be based on such a sequence of monitoring signal values.

Process block 810 can be triggered by a Start trigger 801, or by resuming or continuing from other operations as illustrated in one or more portions of the flowcharts 800, 802 as indicated by flowchart connector 805. In further examples, the input 805 to block 810 can be omitted, and process block 810 can run autonomously once initiated by a Start trigger 801, to acquire a succession of monitoring datapoints during a delayering procedure. Process block 810 can be controlled by one or more predetermined or adaptive parameters 881. These parameters can include specification of a monitoring modality (e.g. current or image), and associated parameters (e.g. frequency of acquiring successive monitoring datapoints, a region of interest within an image, or coefficients associated with extraction of an image parameter at block 814).

In some examples, the raw datapoints obtained at process block 810 can be smoothed with a rolling average at process block 820. The rolling average can be a moving average of the last N datapoints, with N being an integer greater than or equal to two. Other finite impulse response filters (e.g. fixed length digital filters) or infinite impulse response filters (e.g. exponential averaging) can also be used at block 820. Block 820 can output a smoothed datapoint which can be at the same rate as raw datapoints are produced by block 810, or at a different rate. While some examples described herein apply downsampling of monitoring datapoints at block 820, to produce a sequence of smoothed datapoints, this is not a requirement. In other examples, block 820 can interpolate or up sample the monitoring datapoints, or a combination of downsampling and upsampling can be used to obtained smoothed datapoints at a desired rate. Process block 820 can also be controlled by predetermined or adaptive parameters 883. For example, parameters 883 can control which form of averaging to apply, the width of an averaging window, filter coefficients, an output data rate, or any upsampling or downsampling to be applied.

At process block 825, the smoothed datapoint produced by block 820 can be evaluated to determine whether an endpoint has been reached. Endpoint evaluation can be performed by triggering method 802, following connector 803 as shown. However this is not a requirement, and method 800 can stand alone employing a different technique to ascertain whether an endpoint has been reached. Example predetermined parameters 891 can control process block 825, and some example parameters are described in the Appendix. When an endpoint is detected or updated, the method can continue at process block 830. In examples where block 825 invokes method 802, method 802 can return with one or more candidate or confirmed endpoints to process block 830 of method 800, as illustrated by connectors 807. In other examples, the method 800 can follow dashed line from block 825 to block 830 in cases where an endpoint is detected. Some smoothed datapoints, in some cases even a majority of smoothed datapoints, may not result in determination of an endpoint. At process block 830, the current endpoint or any retrospectively changed endpoints can be updated in a log or in software associated with the delayering procedure, so as to keep track of delayering progress.

At decision block 835, a determination can be made whether the delayering should be suspended at the present endpoint. The decision can be controlled by predetermined parameters 885, which can include process flow parameters. A halt decision can be made based on a process flow specification similar to that described in context of FIG. 6B. For example, delayering can be halted based on: the last layer having been reached (item 0.1 in FIG. 6B); if delayering down to the Active layer is not required (item 2.4); or if the last layer at which imaging or analysis is required has been reached (item 2.3). A pause decision can be made based on whether any analysis is required on the layer reached at the present endpoint (items 2.2, 2.3). If no halt or pause is required, the method 800 can proceed via the N branch from block 835 following connector 805 to resume monitoring of datapoints at block 810. However, if suspension is required, the method can follow the Y branch to block 840, where any etching action is halted or paused, for example by turning off an etching beam.

In cases where a halt condition is reached, method 800 is complete after block 840 has been performed. Any files can be saved, logs can be updated and closed, or an etcher can be controlled to execute a shutdown sequence. However, in other cases where delayering is paused, the method can wait until a Resume control signal is received as a trigger 809, upon which a delayering procedure can be resumed at block 845. In examples, an etching beam can be turned back on, and material removal can recommence. Then, the method 800 can continue, following connector 805 to resume monitoring of datapoints at block 810.

Turning to flowchart 802, a method is presented for receiving a monitoring datapoint (in a succession of monitoring datapoints) and determining whether a next endpoint has been reached. Method 802 can be invoked from block 825 of method 800, and can return one or more endpoints or candidates to block 830. However, this is not a requirement. Method 802 can stand alone, determining endpoints from successive datapoints obtained with other methods. Method 802 can be performed using a state machine, such as those described herein.

At decision block 850, a new datapoint can be evaluated to determine whether an event is triggered for a current state of the endpoint detection procedure. To illustrate, if endpoint detection is in a “Find Peak” state and the new datapoint forms a peak inflection, then an exit transition to a “Candidate Peak Found” state can be triggered. Other events can confirm a candidate peak as an endpoint and cause a subsequent transition to a “Find Trough” state.

If no event is triggered at block 850, then method 802 can follow the N branch from block 850 via connector 805 to block 810 of flowchart 800. Otherwise, the method follows the Y branch from block 850 to block 860 where a determination is made whether the triggered event has changed an endpoint—which can occur (i) by direct confirmation of a current candidate peak or trough as an endpoint, (ii) by retrospective promotion of a previously disregarded past peak or trough into a confirmed endpoint, or (iii) by retrospective deprecation of a previously confirmed endpoint into a disregarded peak or trough. Additionally, (iv) a retrospective endpoint change can cause a change of layer identification for subsequent endpoints. If any endpoint change has occurred, the method can follow the Y branch from block 860 via connector 807 to block 830 of flowchart 800. As described herein, corresponding endpoint updates can be made in a buffer or log at block 830. If no endpoint change has occurred, the method can follow the N branch from block 860 via connector 805 to block 810 of flowchart 800, ready to receive the next monitoring data point.

Example Performance Results

FIGS. 9A-9D are graphs 901-904 of some simple monitor signals. The graphs 901-904 show monitor signal amplitude vs time for delayering procedures on respective sample devices, and validate the disclosed technologies across a range of devices having diverse signal waveforms, amplitudes, initial signal shapes, and signal drift. Peaks 911-914 (labeled “Peak”) and troughs 921-924 (labeled “Trough”) are illustrated.

Example Changes of Layer Identification

Figure 10A:
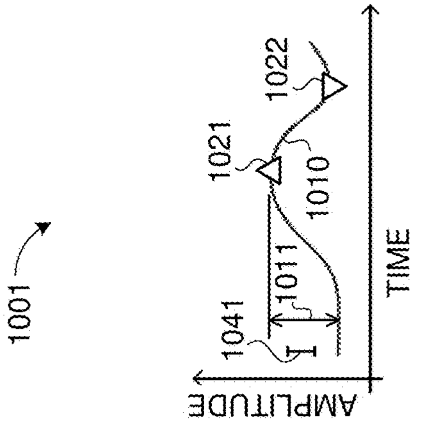
FIGS. 10A-10B are graphs of an evolving monitoring signal illustrating an example recharacterization of past inflections according to the disclosed technologies.
Figure 10B:
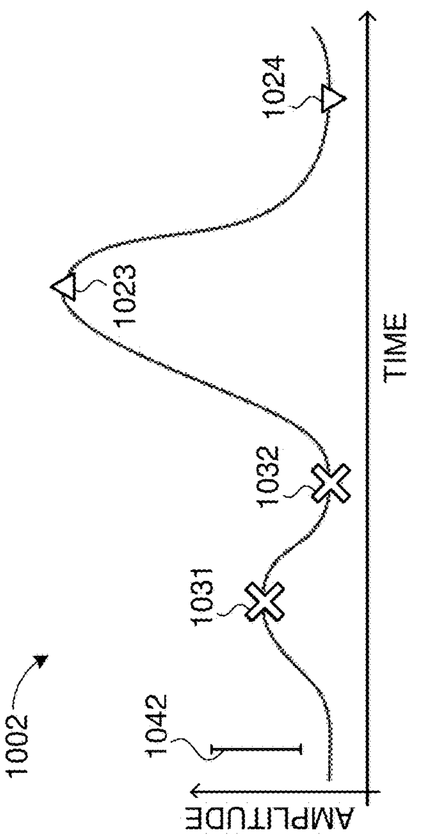

FIGS. 10A-10B are graphs 1001, 1002 of an evolving monitoring signal illustrating an example recharacterization of past inflections. Initially, graph 1001 shows the monitoring signal 1010 as a sample is delayered. Graph 1002 shows the same monitoring signal 1010 after additional time has passed. As indicated by the axes, time proceeds horizontally, while amplitude of the monitoring signal is represented along the vertical axis. Confirmed endpoints are shown as open triangles, while inflections reclassified to disregarded status are shown as crosses.

Starting with graph 1001, marker 1041 indicates an initial value of an amplitude threshold. The height 1011 of inflection 1021 above the initial floor of signal 1010 exceeds the height of marker 1041, and accordingly inflection 1021 can be identified as a peak endpoint. Inflection 1022 can similarly be identified as a trough endpoint. Endpoints 1021, 1022 can be identified with specific layers, e.g. Metal-1 and Via-2 respectively.

Turning to graph 1002, additional inflections 1023, 1024 are seen and can be initially identified as endpoints for the next layers, e.g. Metal-3 and Via-4 respectively. However, with four endpoints 1021-1024 having been identified, the amplitude threshold can be dynamically increased, e.g. based on median amplitude swing. Marker 1042 shows an updated value of the amplitude threshold applicable for endpoint detection.

Retrospective evaluation after detection of trough 1024 (or after peak 1023) can test prior endpoints 1021, 1022 against the updated amplitude threshold 1042. The height 1011 of peak 1021 falls short of threshold 1042, as does the drop from peak 1021 to trough 1022. Accordingly, endpoints 1021, 1022 can be recharacterized as disregarded inflections, as indicated by markers 1031, 1032. Thereafter, a layer assignment of prior endpoint 1023 can be changed from Metal-3 to Metal-1, and the layer assignment of current endpoint 1024 can be changed from Via-4 to Via-2.

In this example, retrospection is triggered by an update of amplitude threshold after reaching endpoint 1024. Before recharacterization of 1021, 1022, these inflections are associated with layers Metal-1, Via-2 which both precede and are distinct from layer Via-4 associated with endpoint 1024. Additionally, inflections 1021, 1022 are separated from the current endpoint 1024 by one or both of intervening layers Via-2 (1022) or Metal-2 (1123), as identified prior to retrospection. For any of these reasons, recharacterization of endpoints 1021, 1022 is retrospective, which would also be the case if retrospection was triggered after identifying endpoint 1023.

Figure 11:
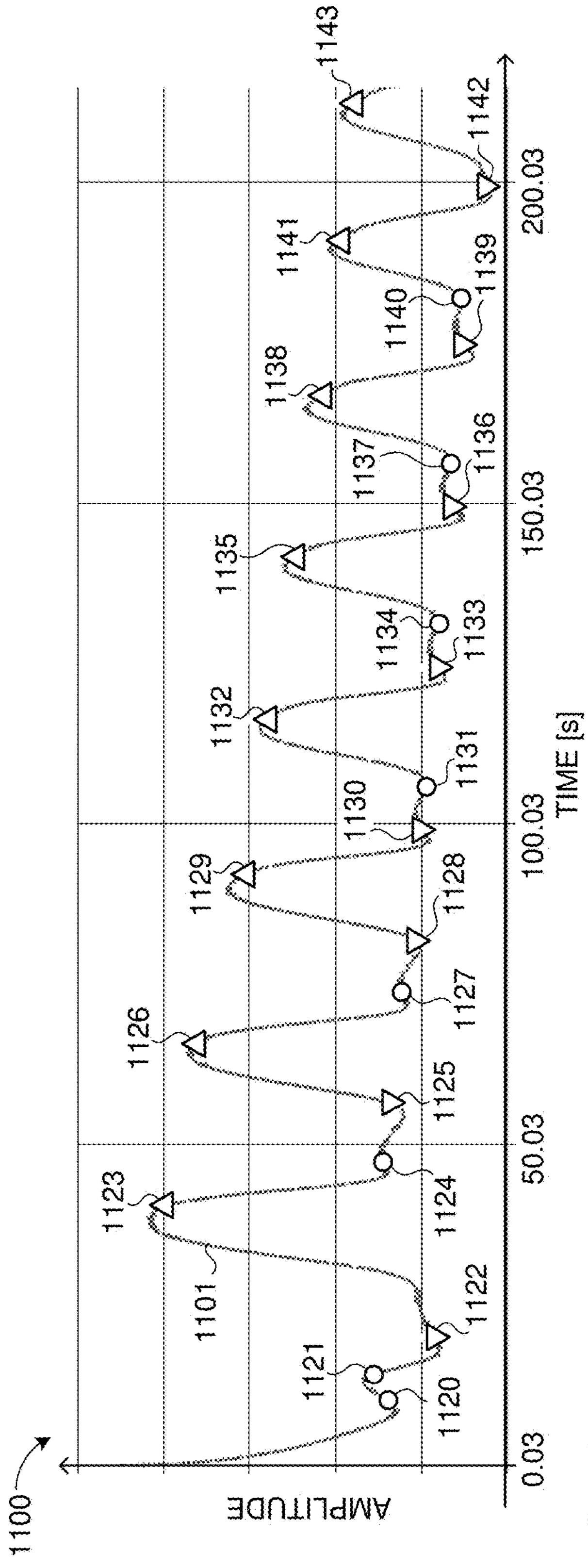
FIG. 11 is a graph of a monitoring signal illustrating another example recharacterization of past inflections according to the disclosed technologies.

FIG. 11 is a graph 1100 of a monitoring signal illustrating another example of recharacterizing prior inflections. The amplitude of monitoring signal 1101 is shown along the vertical axis and time is shown along the horizontal axis. The delayering proceeds at a rate of about 12 seconds per layer—four peaks and four troughs, eight layers total, in about a 100 second interval. Various peaks and troughs, including endpoints, are marked 1120-1143 on FIG. 11. Confirmed endpoints, as described below are shown as upward and downward pointing triangles for peaks and troughs respectively. Other inflections described below are marked as circles.

In this example, inflections 1120-1122 are initially identified as endpoints of layers Via-0, Metal-1, and Via-2 in a manner similar to endpoints 1021, 1022 in graph 1001. Subsequently, after peak 1123 causes recalibration of the amplitude threshold, retrospective evaluation can determine that 1121 was mis-identified as an endpoint, and that the set of inflections 1120-1122 has but a single trough. Because trough 1122 is lower than trough 1120, layer Via-0 can be remapped to trough 1122, while inflections 1120, 1121 can be disregarded. Relabeling of trough 1122 can also cause current peak 1123 to be relabeled from Metal-3 to Metal-1.

Similarly to FIG. 10, prior to re-evaluation, endpoints 1120-1122 (as initially confirmed) pertain to earlier layers than the instant layer of endpoint 1123. Thus, these are prior endpoints and disregarding or relabeling these endpoints is retrospective as described herein. Additionally, endpoints 1120-1121 (as initially confirmed) were separated from endpoint 1123 by intervening layer Via-2 initially associated with endpoint 1122 prior to re-evaluation.

Then, following the trailing edge of peak 1123, trough 1124 can be flagged as a candidate endpoint, and displaced shortly thereafter by deeper trough 1125. (Because this can be done at the instant layer (Via-2), before endpoint 1126 is reached, deprecation of candidate endpoint 1124 can be done without retrospection.) The subsequent triplet 1126-1128 is similar, leading to peak endpoint 1129. Like trough 1124, trough 1130 can be flagged as a candidate endpoint. In this case, subsequent trough 1131 is shallower than trough 1130, so that when the leading edge of peak 1132 crosses the (dynamically updated) amplitude threshold, trough 1130 is confirmed as an endpoint, for layer Via-6. The next three triplets 1132-1134, 1135-1137, 1138-1140 are similar, eventually leading to peak endpoint 1141 for layer Metal-13. The following trough 1142 has no competing trough, and can be confirmed as a trough endpoint during the rising edge of peak 1143.

Additional Example Changes of Layer Identification

Figure 12:
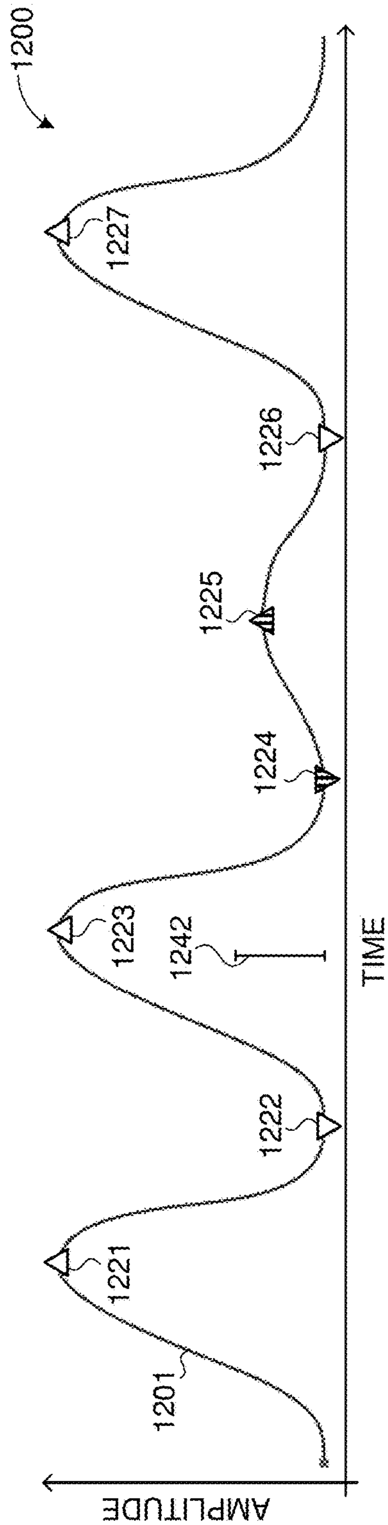
FIG. 12 is a graph of a monitoring signal illustrating an example of a missed period according to the disclosed technologies.

FIG. 12 is a graph 1200 of a monitoring signal illustrating an example of a missed period. The amplitude of monitoring signal 1201 is shown along the vertical axis and time is shown along the horizontal axis. Open triangles mark endpoints identified during delayering directly, i.e. without retrospection. Cross-hatched triangles mark endpoints identified through retrospective evaluation. Also shown in FIG. 12 is marker 1242 indicating an amplitude threshold.

Peaks 1221, 1223 and trough 1222 are all readily determined to be endpoints. In a conventional approach, trough 1224 can be recorded as a candidate endpoint. Peak inflection 1225 does not have a sufficient height over trough 1224 to be marked as a candidate endpoint, and the endpoint detection proceeds to trough 1226. Being lower than trough 1224, the latter is displaced, and when the rising edge to peak 1227 qualifies trough 1226 as the sole endpoint between peaks 1223, 1227. Thus, with a conventional approach, the spacing between peaks 1223, 1227 is about twice the spacing between peaks 1221, 1223. Layers can be missed, leading to mis-identification of a desired target layer and potentially invalid analysis performed at the wrong layer.

The disclosed technologies can resolve this problem. After trough 1224 is recorded in a buffer as a candidate endpoint, the innovative endpoint detection can detect peak 1225, which is properly positioned about one period past previous peak 1223, but which has an amplitude below threshold 1242. Peak 1225 can be recorded in the buffer as a candidate peak (dubbed a "short peak"). Endpoint detection can proceed to trough 1226, which is properly positioned about half a period past candidate peak 1225 and also has insufficient amplitude relative to peak 1225. Trough 1226 can also be recorded in the buffer as a candidate endpoint, leaving three candidate inflections 1224-1226 in the buffer, following the last confirmed endpoint 1223. At this point, retrospective evaluation can be triggered, and can confirm trough 1224 and peak 1225 as endpoints (based on the spacing in either time or depth relative to earlier endpoints), while leaving current candidate trough 1226 in the buffer. Finally, the leading edge of peak 1227 exceeds amplitude threshold 1242, and current trough 1226 can be confirmed as an endpoint without retrospection.

In this example, retrospection is triggered by detection of candidate endpoint 1226. After re-evaluation, endpoints 1224, 1225 are associated with layers preceding that of candidate endpoint 1226. Accordingly inflections 1224, 1225 are prior to current inflection 1226, and the confirmation of endpoints 1224, 1225 is retrospective as described herein. Additionally, endpoints 1224, 1226 are separated by the intervening layer of endpoint 1225.

Figure 13:
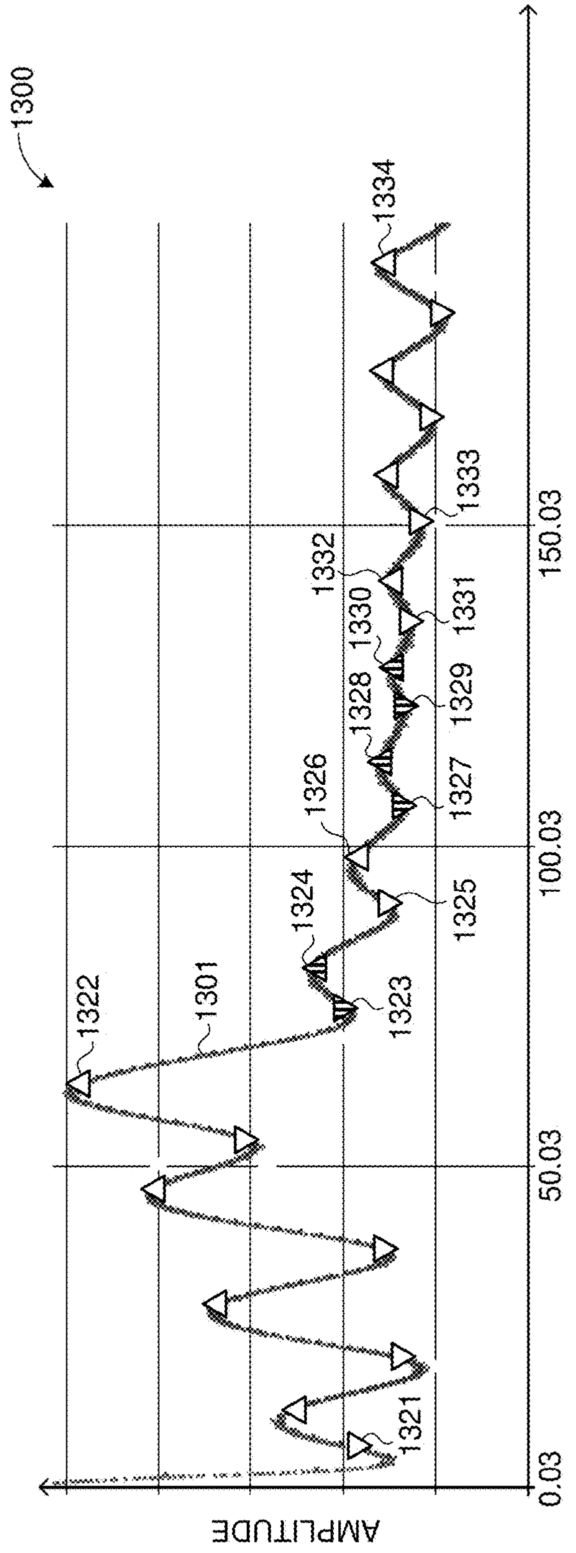
FIG. 13 is a graph of a monitoring signal illustrating another example of retrospective layer identification according to the disclosed technologies.

FIG. 13 is a graph 1300 of a monitoring signal illustrating another example of retrospective layer identification. The amplitude of monitoring signal 1301 is shown along the vertical axis and time is shown along the horizontal axis. Open triangles mark endpoints identified during delayering directly, i.e. without retrospection. Cross-hatched triangles mark endpoints identified through retrospective evaluation. In this example, the adaptive amplitude threshold is configured to drop promptly when preceding excursions between peaks and troughs drop, but rise only slowly when excursions rise.

Initially, endpoints 1321-1322 can be readily determined, as each excursion between neighboring peaks and troughs exceeds the applicable amplitude threshold. Then inflections 1323-1325 can be respectively identified as candidate trough, short peak, and candidate trough respectively, leading to retrospection as described in context of FIG. 12, which can confirm trough 1323 and peak 1324 as respective endpoints. Additionally, endpoint post-processing (similar to block 450 of FIG. 4) can dynamically lower the amplitude threshold, so that the leading and trailing edges of peak 1326 can respectively confirm endpoints 1325, 1326 without retrospection. However, the rising edge of peak 1328 falls short of even the lowered amplitude threshold, and another triplet of inflections 1327-1329 leads again to retrospective evaluation and confirmation of endpoints 1327, 1328. The rising edge of peak 1330 also falls short of the dynamic amplitude threshold, and triplet 1329-1331 leads to (back-to-back) invocation of retrospective evaluation, and thereby confirmation of endpoints 1329-1330. Thereafter, the trough-to-peak excursions increase, and endpoints 1331-1332 can both be identified without retrospection before trough 1333 is reached. The subsequent endpoints 1333-1334 can also be directly determined.

Confirmation of endpoints 1323-1324 and 1327-1330 are all retrospective.

Fifth Example Method

Figure 14:
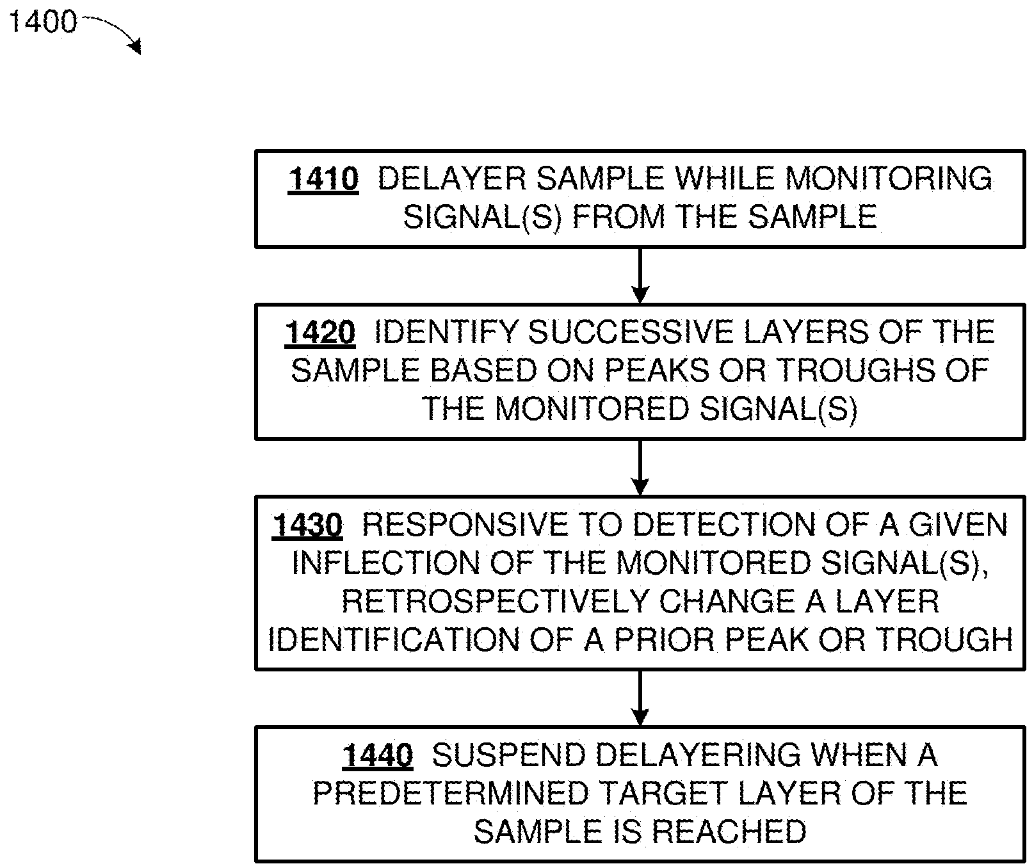
FIG. 14 is a flowchart of a fifth example method, for delayering a sample with retrospective endpoint detection according to the disclosed technologies.

FIG. 14 is a flowchart 1400 of a fifth example method for delayering a sample, incorporating retrospective endpoint detection. In this method, target layer identification is aided by retrospective recharacterization for an earlier layer. Although shown sequentially, process blocks 1410-1430 can be performed concurrently.

At process block 1410, a sample can be delayered while monitoring one or more signals from the sample. Delayering can be performed as described in context of FIG. 1, FIG. 8, or elsewhere herein.

At process block 1420, each of successive layers of the sample can be identified based on a peak or a trough of a monitored signal. The delayering of block 1410 can continue as block 1420 is performed. Layer identification can be performed as described in context of FIGS. 4, 7, 18-19 or elsewhere herein. As described herein, layer identification at block 1420 can be subject to retrospective re-evaluation.

During the delayering, a given inflection (e.g. peak or trough) of the monitored signal can be detected and, in response, a layer identification of a prior peak or trough can be changed retrospectively at process block 1430. Delayering at block 1410 can continue as block 1430 is performed, and layer identification at block 1420 can continue after block 1430 is performed. The retrospective changes can be performed as described in context of FIGS. 10-13, 18, 20 or elsewhere herein.

When a predetermined target layer is reached, the delayering can be suspended at process block 1440. Identification of the predetermined target layer can be dependent on the changed layer identification of block 1430.

Numerous extensions or variations of the fifth method can be implemented within the scope of the disclosed technologies. In some examples, the prior peak or trough can be changed from a disregarded peak or trough to a peak or trough identifying a particular layer among the successive layers (FIGS. 12-13). The layer identification can be changed based on periodicity of the peaks or troughs, which can be a period or a half-period. In some examples, a disregarded prior peak or trough can be confirmed as an endpoint based on the periodicity.

Alternatively or additionally, the prior peak or trough can be changed from a peak or trough identifying a particular layer among the successive layers to a disregarded peak or trough (FIGS. 10-11). A disregarded peak or trough is not an endpoint. In further examples, the layer identification can be changed based on an updated amplitude threshold. The amplitude threshold can be updated responsive to the detection of the given peak or trough. In some examples, a previously confirmed prior endpoint can be changed to disregarded status based on the updated amplitude threshold.

The identification of layers can be performed using endpoint detection as described herein, with one or more adaptive parameters, to detect the peaks and troughs and identify endpoints among them. The adaptive parameters can be stored for subsequent use during delayering of a second sample. The endpoint detection can be performed using a state machine. The adaptive parameter(s) can include a width of an averaging window (e.g. in number of samples, or as a time duration). The width of the averaging window can be updated based on one or more waveform parameters of the monitored signal(s). The delayering can be controlled by one set of parameters in a first zone up to a transition layer, and can be controlled by another set of parameters in a second zone after the transition layer (FIG. 3).

Another retrospective evaluation can be performed in response to the detection of another peak or trough of the monitored signal(s), and this retrospective evaluation can leave all layer identifications unchanged.

In various examples, (i) the given peak or trough and the prior peak or trough can be endpoints of distinct respective layers before the changed layer identification (FIGS. 10-11), (ii) the given peak or trough and the prior peak or trough can be endpoints of distinct respective layers after the changed layer identification (FIGS. 12-13), or (iii) the given peak or trough and the prior peak or trough can be separated by an endpoint of an intervening layer (FIGS. 10-13). Other reference points of a monitoring signal waveform can be used in lieu of peaks and troughs.

The method can be performed by an apparatus similar to that described in context of FIG. 2, based on instructions stored on computer-readable media and executed by one or more hardware processors. The apparatus can include a focused ion beam (FIB) etcher. The apparatus can include a scanning electron microscope (SEM) configured to generate sample images during the delayering. Image brightness, contrast, or another property of the SEM images can be used for monitoring delayering. Alternatively or additionally, stage current or secondary current can be used for monitoring delayering.

The sample can be a semiconductor device, a memory device, or a logic device. For a memory device, the predetermined target layer can be at or below the tenth metal layer (Metal-21 according to layer numbering described herein). For a logic device, the predetermined target layer can be at or below the third via layer of the logic device (Via-6 according to layer numbering described herein, and excluding any precursor trough "Via-0" encountered above Metal-1). Responsive to suspension of delayering at the target layer, an analysis on the sample can be performed.

Example Adaptive Averaging

Figure 15:
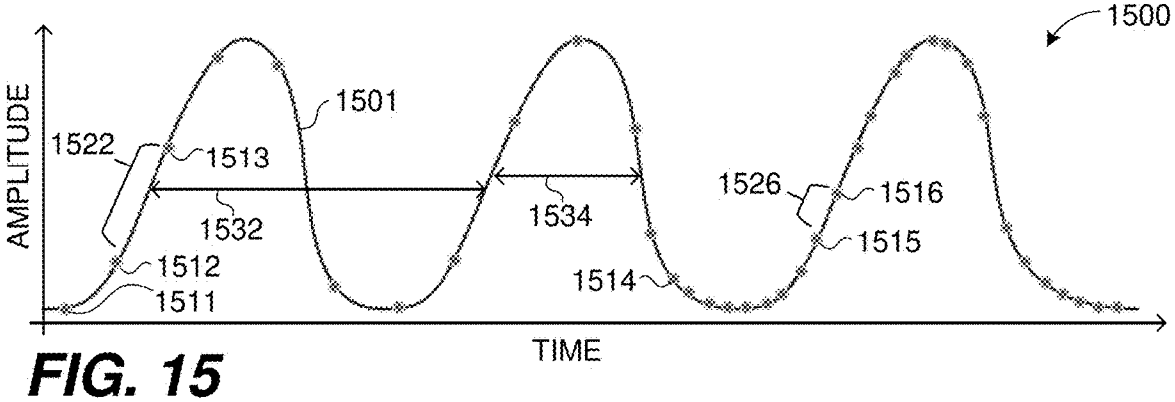
FIG. 15 is a graph of a monitoring signal illustrating an example of adaptive averaging according to the disclosed technologies.

FIG. 15 is a graph 1500 of a monitoring signal illustrating an example of adaptive averaging. The amplitude of monitoring signal 1501 is shown along the vertical axis and time is shown along the horizontal axis. Measurements of monitoring signal 1501 can be taken at regular or irregular intervals of time. The measurement points are shown as circles in FIG. 15, and some are labeled 1511-1515. The measurement value reported at each measurement point 1511-1515 can be averaged or integrated over the time interval ("measurement interval" or "averaging window") since the preceding measurement point. Thus, the value reported at point 1513 can be an average of the monitored signal 1501 over the interval 1522.

Choice of a suitable width for a measurement interval can be a balance of competing factors. If the measurement interval is too narrow, endpoint detection can be dominated by noise. A large number of inflections can be observed within a single layer, with increased computational burden, and also some likelihood of an incorrect inflection being identified as the endpoint. Conversely, if the measurement time interval is too wide, an unacceptable lag (e.g. half or more the width of the measurement interval) can arise in endpoint detection. That is, delayering may have proceeded well past the desired endpoint before the endpoint is detected. Additionally, the curvature of the monitored signal can lead to inaccuracy in the measurement value.

Adaptive selection of the measurement interval is dubbed "adaptive averaging" and can balance these factors so that a suitable or optimum measurement interval is selected.

As illustrated in FIG. 15, initially a conservative (wide) measurement interval (e.g. 1522) can be selected. After one and a half periods of the monitoring signal, at point 1514, waveform parameters can be determined with enough confidence to modify the measurement interval. Non-limiting examples of suitable waveform parameters include waveform period 1532, full-width at half-maximum 1534, or other similar parameters. In the illustrated example, measurement points are increase from about six per period (before point 1514) to about 21 per period (after point 1514) to reduce lag and improve measurement accuracy. In varying examples, about 20, about 35, or in a range from 10 to 50 measurement points can be suitably acquired per period of the monitoring signal. In further examples, selection of the measurement interval can also be based partly on the observed noise of the monitored signal.

Adaptive averaging can eliminate the use of a trial run to determine a suitable measurement interval. Additionally, adaptive averaging can run continuously during delayering, allowing the measurement interval to adapt as layer thickness changes during delayering.

Figure 16:
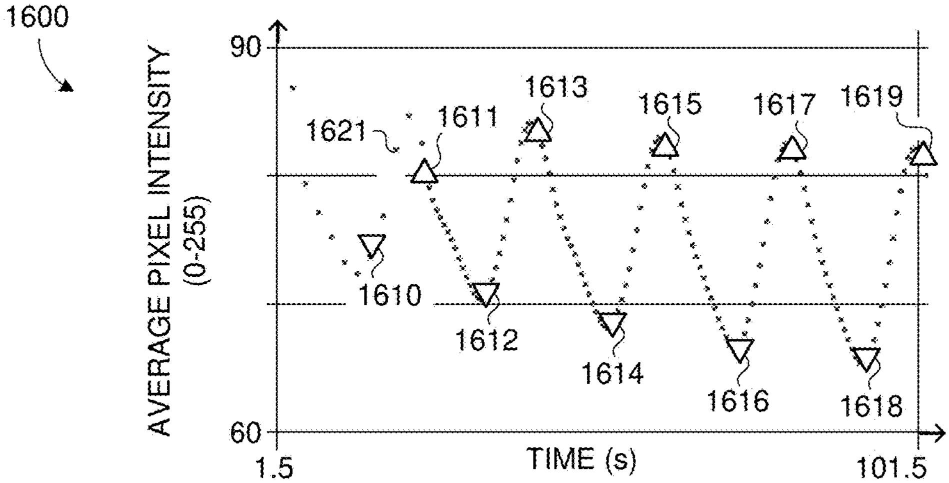
FIG. 16 is a graph of a monitoring signal illustrating another example of adaptive averaging according to the disclosed technologies.

FIG. 16 is a graph 1600 of a monitoring signal illustrating another example of adaptive averaging according to the disclosed technologies. Discrete measurement points 1621 are shown over a 100 second span of a delayering procedure on a sample. In this example, the monitored signal is an average brightness of a surface image (e.g. SEM) on an 8-bit grayscale ranging from 0 to 255. Identified endpoints 1610-1619 are shown by upward pointing triangles for peaks or downward pointing triangles for troughs. As illustrated, an initial measurement interval setting leads to about 10 points per period. At about endpoint 1611, the waveform period can be determined and used to reduce the measurement interval, so as to obtain about 35 measurement points per period.

In FIG. 16, endpoints are shown about one measurement interval after the center of the corresponding inflection, based on where the inflection is identified. Reducing the measurement interval brings the subsequent endpoints 1612-1619 closer to the signal extrema, thus improving accuracy of endpoint determination.

Example State Diagrams

Figure 17:
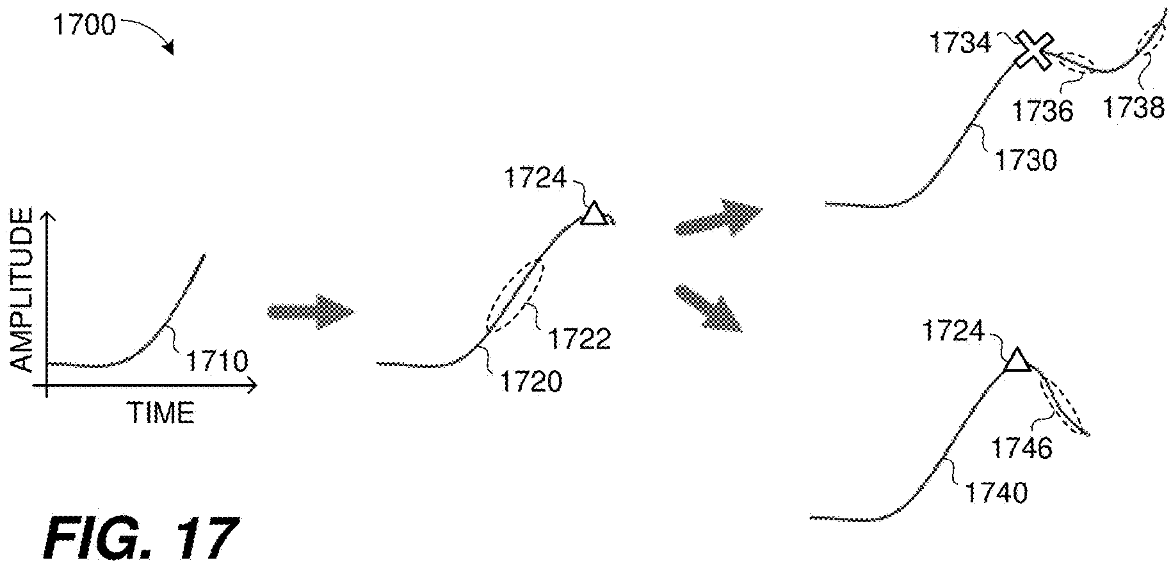
FIG. 17 is a sequence of graphs illustrating progression of states for an example of the disclosed technologies.

FIG. 17 is a sequence of graphs illustrating a simplified progression of states for a delayering procedure. Initially, graph 1710 shows an evolving monitoring signal as a sample is delayered. As indicated by the axes, time proceeds horizontally, while amplitude of the monitoring signal is represented along the vertical axis. Although not explicitly shown, remaining graphs 1720, 1730, 1740 utilize similar axes. Graph 1710 shows the amplitude of the monitored signal rising over time, indicating that a peak can be expected. The endpoint detection state can be "Find Peak".

Graph 1720 shows the same signal after some time has passed. The signal amplitude is seen to have continued rising beyond the extent of graph 1710, and eventually reaching an inflection 1724. Because the leading edge 1722 has amplitude exceeding a threshold, inflection 1724 is a candidate for a peak endpoint locating an instant layer of the sample. The endpoint detection state can be "Found Candidate Peak".

Graphs 1730, 1740 show two possible cases as delayering progresses and the monitored signal continues to evolve. In the case of graph 1730, the trailing edge 1736 of inflection 1724 has insufficient amplitude to confirm inflection 1724 as an endpoint for the current layer. Rather, the signal 1730 continues to rise (1738) beyond the amplitude of inflection 1724. Inflection 1724 can be disregarded, as indicated by cross 1734, and delayering can proceed, in search of the actual endpoint for the current layer. As inflection 1724 is disregarded, endpoint detection can revert to the "Find Peak" state.

In the case of graph 1740, the trailing edge 1746 following candidate peak 1724 falls sufficiently to allow inflection 1724 to be confirmed as identifying or locating the current layer. With peak 1724 confirmed, a trough endpoint can be expected next, and the endpoint detection can progress to a "Find Trough" state.

Figure 18:
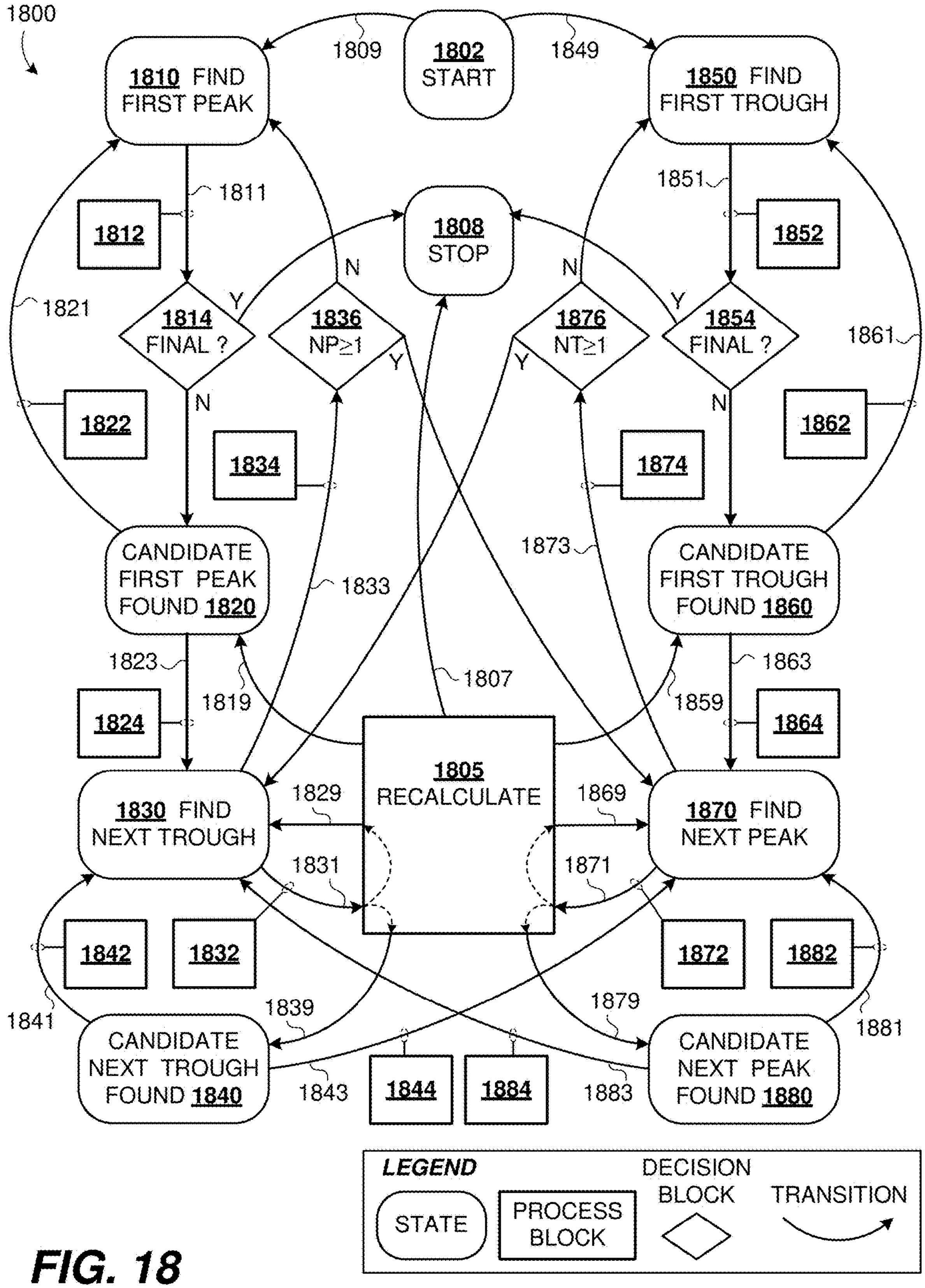
FIG. 18 is a state diagram which can be employed in examples of the disclosed technologies.

FIG. 18 is a state diagram 1800 of a state machine which can control an innovative endpoint detection procedure. At a high level, FIG. 18 alternates between finding peak endpoints and trough endpoints. First peak or first trough are treated as special cases, and provisions are made for candidate peaks to be confirmed or disregarded as described in context of FIG. 17 above. The endpoint detection procedure follows the state diagram and transitions among illustrated states based on one or more monitored signals. A legend shows the representation of states, process blocks, decision blocks, and transitions in FIG. 18.

Initially, endpoint detection begins in start state 1802. In some examples, the endpoint detection procedure may have no a priori information about the anticipated layer structure while, in other examples, the endpoint detection procedure may have partial a priori information preconfigured, e.g. from operator's knowledge of an instant sample or from a trial delayering. In further examples, the endpoint detection can be similar to an earlier delayering operation on the same or another sample, and the anticipated layer structure, measurement interval, and other parameters can be expected to be very similar to those previously used or encountered. The state diagram of FIG. 18 can be suitable for all of these cases.

In state 1802, the endpoint detection can keep track of maximum and minimum of the observed monitored signal. To exit state 1802, the monitored signal can be required to be rising or falling with sufficient magnitude to distinguish from noise fluctuations. Thus, event 1809 can be a rising waveform with rise exceeding a threshold, which can lead to state 1810 "Find First Peak". Similarly, event 1849 can be a falling waveform with fall exceeding a threshold, leading to state 1850 "Find First Trough". Whether rise and fall exceed a respective threshold can be determined based on a difference between minimum and maximum of the monitored signal. Whether the monitored signal is rising can be determined by comparing the most recent measurement with: a previous maximum, a previous measurement, an average of the minimum and maximum values, or in other ways. A determination of a falling signal can be made similarly.

Turning to state 1810, endpoint detection can exit from state 1810 upon detection of an inflection (event 1811, similar to detection of inflection 1724 in FIG. 17). An inflection in a rising signal, where the amplitude threshold requirement has already been met (at event 1809), can be a candidate peak endpoint, and can be recorded as such in a memory buffer at process block 1812. At decision block 1814, a test can be made to determine the next state. If no further endpoints (peaks or troughs) are required, the Y branch from block 1814 can be followed to Stop state 1808, terminating the endpoint detection procedure. Otherwise, the N branch from block 1814 leads to state 1820 "Candidate First Peak Found".

State 1820 is shown having two exit events 1821, 1823. Event 1821 occurs if a monitored signal measurement value exceeds the amplitude of the candidate peak recorded at block 1812. This indicates that a superior peak is expected and the recorded peak can be disregarded (similar to 1734 of FIG. 17). Accordingly, at process block 1822, the recorded peak can be deleted and endpoint detection can revert to state 1810. Alternatively, event 1823 can occur if a monitored signal measurement value is at least an amplitude threshold below the recorded candidate peak (similar to trailing edge 1746 of FIG. 17). Then, the candidate peak can be confirmed as the endpoint for the current layer, and endpoint detection can proceed to state 1830 "Find Next Trough".

In examples, a layer index can be maintained during endpoint detection. Because the state machine switches from peak-detecting to trough-detecting at transition 1823, the layer index can be incremented at block 1824, e.g. from 1 (for Metal-1) to 2 (for Via-2). Different schemes can equivalently be used for layer indexing, and embodiments can vary in how the layer index is incremented or decremented.

State 1830 is shown having two exit events 1831, 1833. Event 1831 occurs if an inflection is found. An inflection in a falling signal, where the amplitude threshold requirement has already been met (e.g. at event 1823) can be a candidate trough, and can be recorded as such at process block 1832. With a candidate trough recorded (whether or not this trough is later confirmed or disregarded) the state diagram can proceed to process block 1805 to review prior endpoints. Process block 1805 is described further below.

In common situations, e.g. review at block 1805 maintains all prior endpoints, endpoint detection can enter block 1805 from state 1830, and then continue on to state 1840 "Candidate Next Trough Found" via path 1839. Similar to state 1820, state 1840 is shown having two exit events 1841, 1843. Event 1841 occurs if a monitored signal measurement is lower than the candidate trough recorded at block 1832. This indicates that the candidate trough is expected to be superseded by another trough and the recorded trough can be disregarded. Accordingly, at process block 1842, the recorded trough can be deleted and endpoint detection can revert to state 1830. Alternatively, event 1843 can occur if a monitored signal measurement value is at least an amplitude threshold above the recorded candidate trough, similar but opposite to the situation described for peak trailing edge 1746 of FIG. 17. Then, the candidate trough can be confirmed as the endpoint for the current layer, and endpoint detection can proceed to state 1870 "Find Next Peak". In some examples, the layer index can be incremented at block 1844.

Turning back to transition 1831, endpoint detection can enter block 1805 from state 1830, but in other situations the trough recorded at block 1832 may be rejected. In such situations, endpoint detection can return to state 1830 via path 1829, with the candidate trough of block 1832 retained in the buffer. Thereafter, both exits from state 1830 are available: another inflection can be found, leading to exit via path 1831 as previously described; or a rising signal can cross a threshold leading to exit via path 1833. For exit via path 1831, the new inflection recorded at block 1832 can, in some embodiments, overwrite a previous inflection recorded at block 1832, or can be appended to the buffer in other embodiments. For exit via path 1833, all candidate inflections recorded at block 1832 can be flushed from the buffer at block 1834 before transitioning to one of the "Find Peak" states, and a layer index can be decremented. At decision block 1836 a determination is made whether at least one confirmed peak endpoint has been identified (e.g. number of peaks NPK≥1). If not, endpoint detection follows the N branch from decision block 1836 to state 1810 "Find First Peak". Otherwise, endpoint detection follows the Y branch from decision block 1836 to state 1870 "Find Next Peak" which is a counterpart of, and similar to, block 1840 "Find Next Trough".

Turning to state 1850, the right side of FIG. 18 operates in a substantially similar fashion as the left side, albeit with peaks and troughs interchanged and respective modifications of the attendant signal waveform features. An inflection in a falling monitored signal, where the amplitude threshold requirement has already been met at event 1849, serves as event 1851 to exit from state 1850. The inflection can be recorded as a candidate trough at process block 1852. At decision block 1854, a test can be made to determine the next state. If no further endpoints (peaks or troughs) are required, the Y branch from block 1854 can be followed to Stop state 1808, terminating the endpoint detection procedure. Otherwise, the N branch from block 1854 leads to state 1860 "Candidate First Trough Found".

State 1860 is shown having two exit events 1861, 1863. Event 1861 occurs if a monitored signal measurement value descends below the amplitude of the candidate trough recorded at block 1852. This indicates that the candidate trough is expected to be superseded by another trough and the recorded trough can be disregarded. Accordingly, at process block 1862, the recorded trough can be deleted and endpoint detection can revert to state 1850. Alternatively, event 1863 can occur if a monitored signal measurement value is at least an amplitude threshold above the recorded candidate trough. Then, the candidate trough can be confirmed as the endpoint for the current layer, and endpoint detection can proceed to state 1870 "Find Next Peak", with layer index being incremented at block 1864.

State 1870 is shown having two exit events 1871, 1873. Event 1871 occurs if an inflection is found. An inflection in a rising signal, where the amplitude threshold requirement has already been met (e.g. at event 1863) can be a candidate peak, and can be recorded as such at process block 1872. With a candidate peak recorded (whether or not this peak is later confirmed or disregarded) the state diagram can proceed to process block 1805 to review prior endpoints.

In common situations, e.g. review at block 1805 maintains all prior endpoints, endpoint detection can enter block 1805 from state 1870, and then continue on to state 1880 "Candidate Next Peak Found" via path 1879. Similar to state 1820, state 1880 is shown having two exit events 1881, 1883. Event 1881 occurs if a monitored signal measurement is higher than the candidate peak recorded at block 1872. This indicates that the candidate peak is expected to be superseded by another peak and the recorded peak can be disregarded. Accordingly, at process block 1882, the recorded peak can be deleted and endpoint detection can revert to state 1870. Alternatively, event 1883 can occur if a monitored signal measurement value is at least an amplitude threshold below the recorded candidate peak. Then, the candidate peak can be confirmed as the endpoint for the current layer, and endpoint detection can proceed to state 1830 "Find Next Trough", with layer index being incremented at block 1884.

At process block 1805, retrospective evaluation can be performed on prior peaks and troughs (e.g. including candidate endpoints and confirmed endpoints). In some instances, review can lead to one or more prior peaks or troughs being promoted from disregarded inflections to endpoints for respective layers. In other instances, review can lead to one or more confirmed peaks or troughs being demoted to disregarded peaks or troughs. In either case, recharacterization of prior peaks or troughs can be accompanied by reassignment of layer numbers to all subsequent peaks or troughs as well, and an update of the current layer index. Thereby, if a most recent peak had been identified as Metal-6, then promotion of an earlier disregarded peak to, say, Metal-4 could also increment the indices of subsequent peaks Metal-4→Metal-6 and Metal-6→Metal-8. Thereby an analytic procedure to be performed at Metal-8 can be performed at the correct layer, which could have been missed through mis-identification by some conventional approaches. Similar considerations apply to demotion of prior peaks or troughs as well. As another example, delayering parameters can be changed from one zone of thick layers to another zone of thin layers. Recharacterization of prior peaks or troughs can facilitate correct identification of a transition layer so that e.g. parameters of an etching beam are changed at the correct layer. In addition to review of prior peaks, a current peak can also be evaluated at block 1805.

Numerous exit conditions can direct the endpoint detection flow from block 1805 to a following state. Entering from state 1830 "Find Next Trough", in most cases the status of candidate trough recorded at block 1832 remains unchanged, and flow can continue via path 1839 to state 1840 "Candidate Next Trough Found". In some cases, the candidate trough can be rejected at block 1805, and flow can return via path 1829 to state 1830 "Find Next Trough". These common paths are shown by dashed lines in FIG. 18. In further cases, demotion of prior endpoints can result in the most recent remaining valid endpoint being a first trough or a first peak, in which case flow can proceed via paths 1859 or 1819 respectively to states 1860 or 1820. Finally, if the final desired endpoint has been reached (with or without promotion of any prior inflection), flow can follow path 1807 to Stop state 1808. In some instances, an error condition can be detected in block 1805, which can also direct flow to Stop state 1808.

Flow from block 1805 when entering from state 1870 "Find Next Peak" is similar. Flow can proceed via paths 1879 or 1869 to states 1880 or 1870 respectively, according to whether the candidate peak recorded at block 1872 remains unchanged or has been rejected. Flow via paths 1859, 1819, or 1807 is also available, and is the same as described above.

Numerous variations or extensions of state diagram 1800 can be implemented within scope of the disclosed technologies. For example, adaptive averaging can be supported by recalculating a measurement interval at one or more of blocks 1832, 1842, 1872, 1882, in addition to the operations already described for these blocks. Adaptive averaging can be predicated on a certain number of endpoints (or, peaks, troughs, or layers) having already been determined. For example, in FIG. 15, a measurement interval is adjusted after two peaks and an intervening trough (3 layers) have been identified while, in FIG. 16, the measurement interval is adapted after a single trough and peak.

Figure 19:
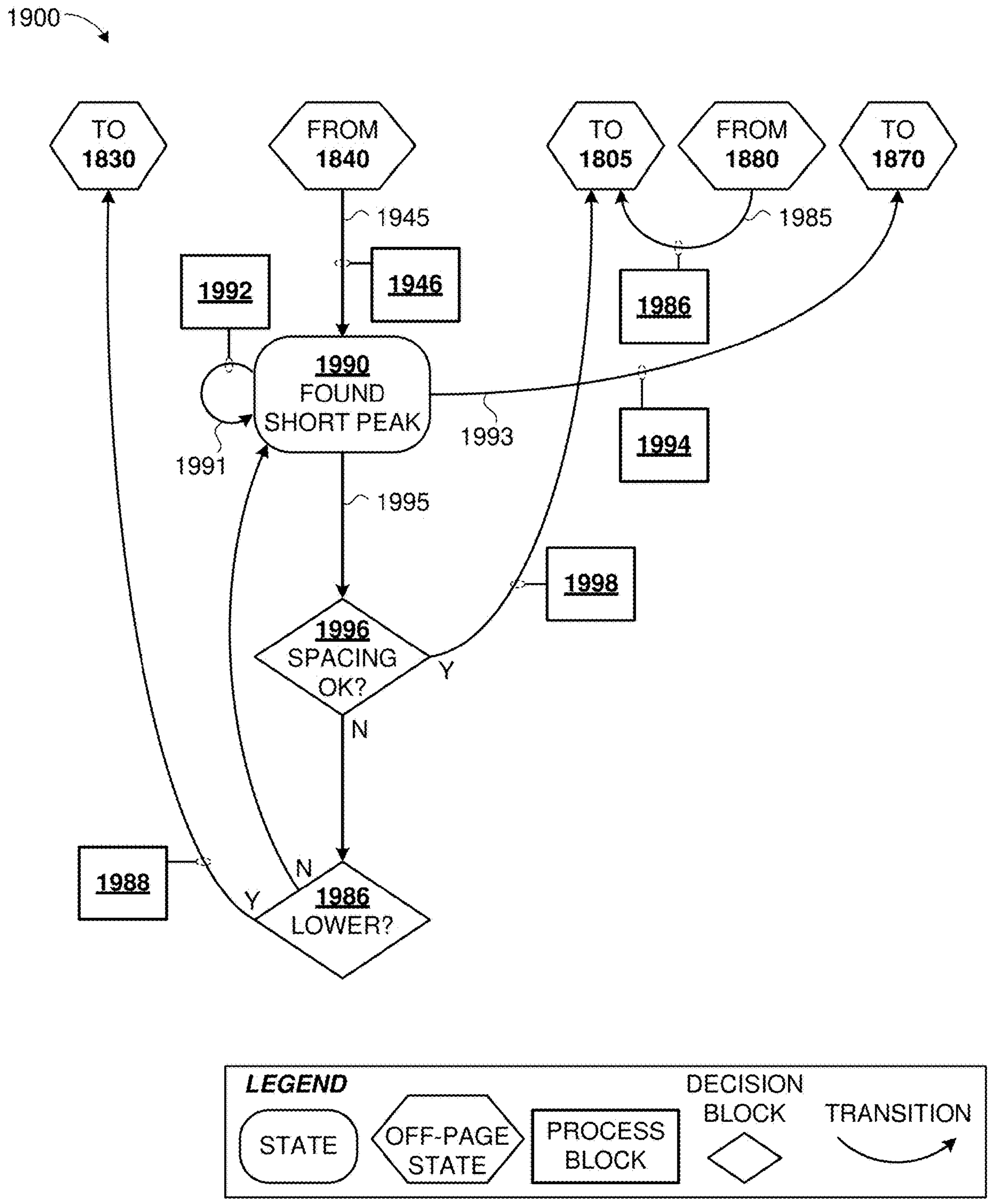
FIG. 19 is a partial state diagram which can be employed in examples of the disclosed technologies.

FIG. 19 is a partial state diagram 1900 for period-based corrections which can augment FIG. 18 or can be used independently of FIG. 18. The description of FIG. 19 incorporates these optional ties to FIG. 18. Above, state 1840 "Candidate Next Trough Found" was described as having two exit events 1841 for rejection of a candidate trough and event 1843 for confirmation of the candidate trough. For FIG. 19, a third exit event 1945 can be added for a (peak) inflection found that is (a) short of the amplitude required to confirm an instant candidate trough, and (b) spaced from a prior peak or trough by an amount consistent with the observed waveform periodicity, to within a predetermined tolerance. A desired spacing can be an integer number of periods (e.g. for peak-to-peak or trough-to-trough spacing) plus an optional half-period (e.g. for peak-to-trough spacing). The short peak can be recorded at process block 1946, following which endpoint detection can enter state 1990 "Found Short Peak".

State 1990 is shown with three transition events 1991, 1993, 1995. Event 1991 occurs if another peak inflection is found higher than the short peak recorded at block 1946. In this case, the recorded short peak can be overwritten at process block 1992 and the state can revert to state 1990. Event 1993 occurs if the monitored signal rises and exceeds the candidate trough (block 1832) by at least the amplitude threshold. In this case, the candidate trough can be confirmed, the short peak can be deleted (as it is expected to be superseded by another peak) at process block 1994, and the endpoint detection can continue to state 1870 "Find Next Peak". Finally, event 1995 occurs if a new trough inflection is encountered, leading to decision block 1996. If the new trough is spaced from a prior peak or trough by an amount consistent with the observed waveform periodicity, to within a predetermined tolerance, then the Y branch is followed from decision block 1996 to process block 1998 where the new trough can also be recorded before the flow proceeds to block 1805 for retrospective evaluation. At this point, two candidate troughs and an intervening short peak have been recorded in a buffer, for evaluation at block 1805 based on the periodicity of the monitoring signal waveform, similar to retrospection triggered at inflection 1226 of FIG. 12 or inflection 1325 of FIG. 13.

Alternatively, if the new trough is not suitably spaced, then the N branch can be followed from decision block 1996 to another decision block 1986 where the new trough amplitude is compared with the candidate trough amplitude previously stored at block 1832. If the new trough is deeper, flow follows the Y branch from decision block 1986 to process block 1988, where the candidate trough and the short peak can both be deleted (rejected) from the buffer before returning to state 1830 "Find Next Trough". Alternatively, if the new trough is shallower than the stored candidate trough, the flow can follow the N branch from decision block 1986, reverting to state 1990—effectively disregarding the new trough.

Also shown in FIG. 19 is a third exit event 1985 from state 1880 "Candidate Next Peak Found". Event 1985 occurs when a (trough) inflection is found that is (a) shy of the amplitude change required to confirm an instant candidate peak, and (b) spaced from a prior peak or trough by an amount consistent with the observed waveform periodicity, to within a predetermined tolerance. The shallow trough can be recorded at process block 1986 and the flow can return to process block 1805 for retrospective evaluation.

Example Retrospective Evaluation

Figure 20:
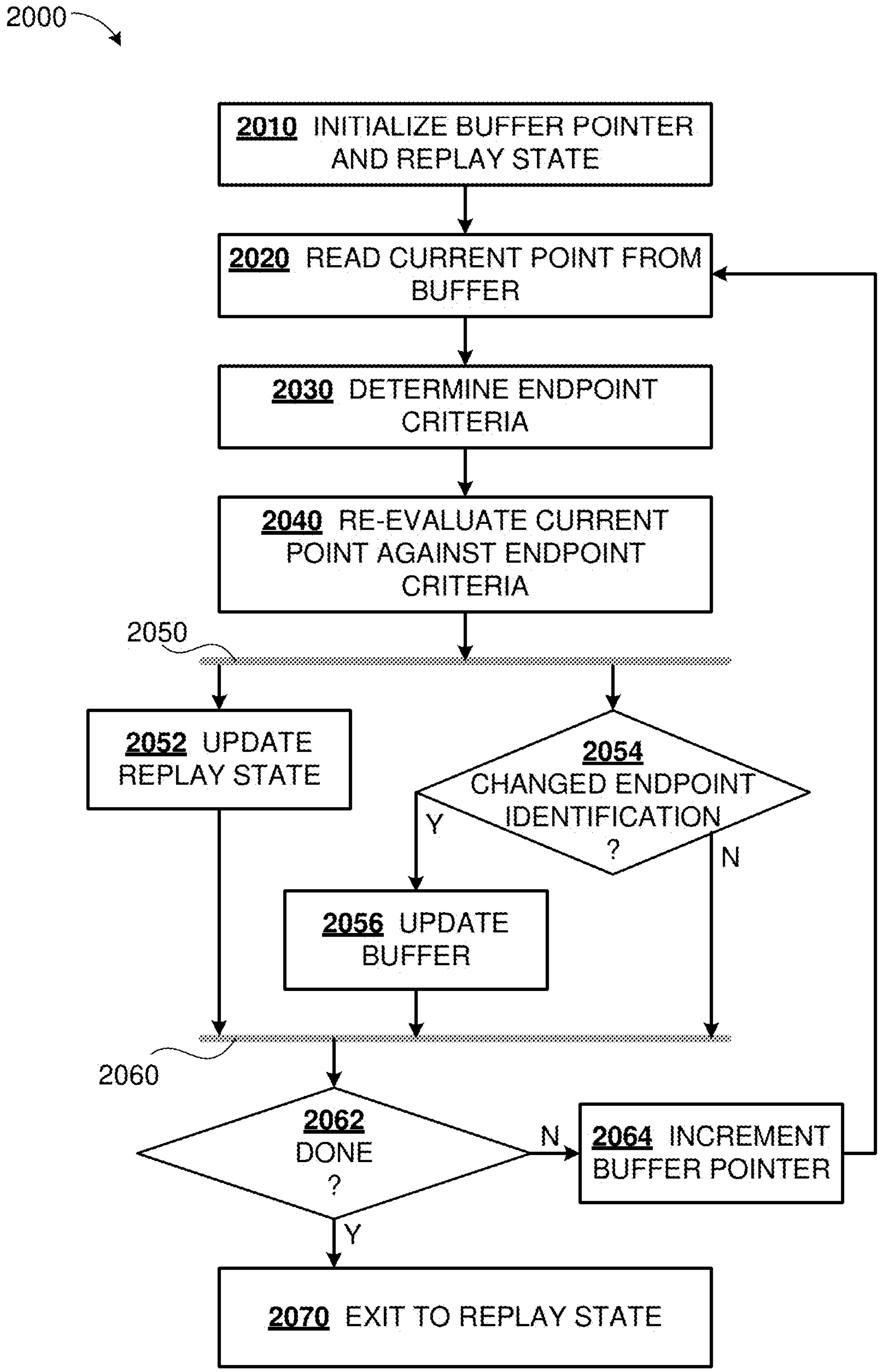
FIG. 20 is a flowchart of an example retrospective evaluation procedure according to the disclosed technologies.

FIG. 20 is a flowchart 2000 of an example retrospective evaluation method. In this method, a list of candidate, past, or current endpoints is replayed and potentially updated in light of up-to-date information about a delayering procedure or associated monitoring signals.

As described herein, inflections (e.g. peaks or troughs) or other reference points can be selected as candidate endpoints during a delayering procedure. These candidate endpoints can be stored in a memory buffer. Some candidate endpoints can be confirmed as endpoints, while others can be disregarded. In varying examples or circumstances, disregarded inflections can be deleted from the buffer or can be retained as candidate endpoints that could be confirmed in a future retrospective evaluation. For each stored point, a coordinate associated with depth can be stored (e.g. depth, time, sample number) along with quantities pertinent to confirmation of the point (e.g. amplitude, rise time, status as a "short peak") and a layer identification.

In examples, the method can be triggered from any of the entry points to block 1805 in FIGS. 18-19, but this is not a requirement and the instant method can be used with other embodiments of endpoint detection. At block 2010, a buffer pointer and a replay state can be initialized. In some examples, the buffer pointer can be set to the first point in the buffer (e.g. an endpoint or candidate inflection for Via-0 or Metal-1 layers), and the replay state can be set to a start state similar to 1802, but this is not a requirement. In other examples, retrospective evaluation can be restricted to fewer than all layers, for example the last four layers, or another predetermined criterion. In such examples, the buffer pointer can be set to an address of the replay starting point and the replay state can be set to an appropriate state (e.g. "Find Next Trough") for the starting point. As the buffered points are replayed, the replay state can follow appropriate states in an endpoint detection state diagram such as FIG. 19.

At block 2020, the current point can be read from the buffer. As described, this point can be any of a candidate or current (confirmed) endpoint, or a disregarded inflection. All stored properties associated with the current point can be read.

At block 2030, up-to-date endpoint criteria can be determined for the current point. For example, a (dynamic) peak threshold can be set equal to a (predetermined) peak transition coefficient times a (dynamic) median peak height. Particularly, the median peak height can reflect the entire current delayering history at the time block 2020 is performed, which can be different from that at the time the current point was initially observed. As another example, if the current point is tagged as a "short peak" then a period or half-period can be determined based on up-to-date information.

At block 2040, the current point can be evaluated against the up-to-date endpoint criteria. As described herein, an initial peak can fail when tested against an up-to-date amplitude threshold, or a short peak can "pass" to be confirmed as an endpoint. Of course, in many situations, re-evaluation can leave the classification of the current point unchanged. Still further, the classification can remain unchanged, but the layer identification can change. For example, rejection of a peak initially identified as Metal-1 can cause a subsequent peak to be relabeled Metal-3→Metal-1.

From block 2040, the method follows two branches via fork 2050. At block 2052, the replay state can be updated. For example, for a confirmed peak endpoint, the replay state can incremented from "Find Next Peak" to "Find Next Trough". In the other branch, the method can check at decision block 2054 whether the endpoint identification has changed (e.g. layer change or classification change). If so, the method can follow the Y branch from block 2054 to block 2056 where the buffer can be updated. Otherwise, the method can proceed directly to join 2060, and then to decision block 2062.

At decision block 2062, a determination is made whether any points remain to be replayed in the buffer. If points remain to be processed, the method follows the N branch from decision block 2062 to increment the buffer pointer and block 2064 before proceeding to block 2020 for reading and re-evaluating the next point in the buffer. If all points are done, however, the method follows the Y branch from decision block 2062 to block 2070, exiting to the calling state machine in whatever state the replay state has reached. For the example of FIG. 19, there are seven possible destination states from block 1905.

Numerous variations and extensions of this method can be implemented within the scope of existing technologies, including some already described above. In some examples, only certain buffered points may be eligible for re-evaluation. In some examples, only a predetermined initial number of endpoints can be eligible for reclassification (e.g. as disregarded inflections). In further examples, short peaks can be ineligible for re-evaluation after being confirmed. Accordingly, a decision block can be placed between blocks 2020, 2030. For eligible points, the method can proceed to block 2030 as described above. For ineligible points, the method can proceed directly to block 2052 for an update of the replay state. The buffer can be organized as a list, as a tree, or as another type of data structure. A tree can be used to maintain both a confirmed endpoint and a rejected candidate endpoint for a given layer, such as points 1127-1128 of FIG. 11.

The illustrated method is only exemplary, and other methods for retrospective evaluation can be used.

A Generalized Computer Environment

Figure 21:
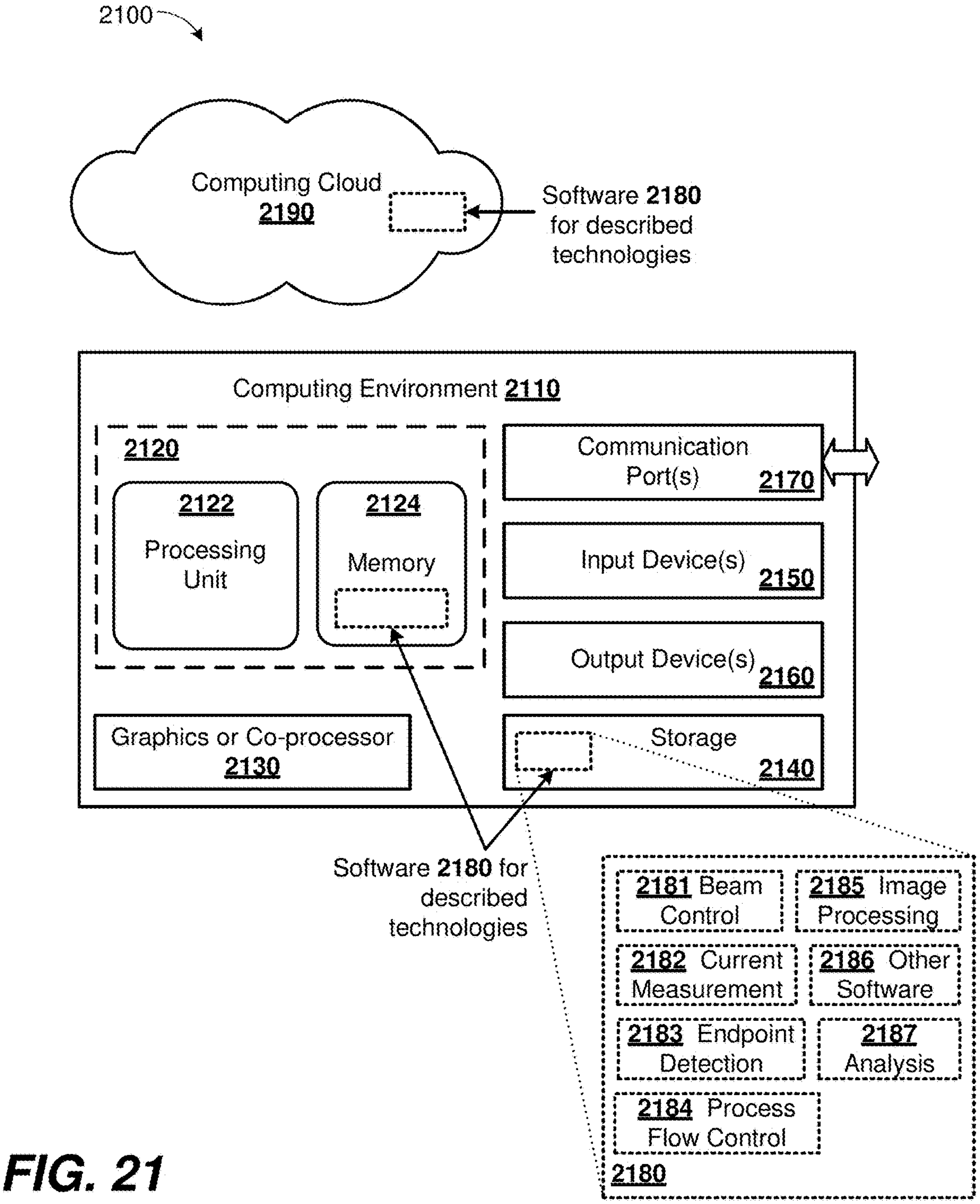
FIG. 21 illustrates a generalized example of a suitable computing environment in which described embodiments, techniques, and technologies pertaining to disclosed delayering methods and apparatus can be implemented.

FIG. 21 illustrates a generalized example of a suitable computing system 2100 in which described examples, techniques, and technologies for sample preparation, with e.g. a focused particle beam or adaptive endpoint detection, can be implemented. The computing system 2100 is not intended to suggest any limitation as to scope of use or functionality of the present disclosure, as the innovations can be implemented in diverse general-purpose or special-purpose computing systems. The computing system 2100 can control a sample preparation system, including an etching tool, an ion milling machine, a gas flow or pumping system, valves, a load lock, a sample handling system, or associated instrumentation; can perform adaptive or retrospective endpoint detection; or can acquire, process, output, or store configuration or measurement data.

With reference to FIG. 21, computing environment 2110 includes one or more processing units 2122 and memory 2124. In FIG. 21, this basic configuration 2120 is included within a dashed line. Processing unit 2122 can execute computer-executable instructions, such as for control or data acquisition as described herein. Processing unit 2122 can be a general-purpose central processing unit (CPU), a processor in an application-specific integrated circuit (ASIC), or any other type of processor. In a multi-processing system, multiple processing units execute computer-executable instructions to increase processing power. Computing environment 2110 can also include a graphics processing unit or co-processing unit 2130. Tangible memory 2124 can be volatile memory (e.g., registers, cache, or RAM), non-volatile memory (e.g., ROM, EEPROM, or flash memory), or some combination thereof, accessible by processing units 2122, 2130. The memory 2124 stores software 2180 implementing one or more innovations described herein, in the form of computer-executable instructions suitable for execution by the processing unit(s) 2122, 2130. For example, software 2180 can include software 2181 for controlling an etching beam (including automated endpoint detection and integrated analysis), software 2182 for controlling current measurement, software 2183 for automated endpoint detection, software for process flow control 2184, software for processing images 2185, analysis software 2187, or other software 2186. The inset shown for software 2180 in storage 2140 can be equally applicable to software 2180 elsewhere in FIG. 21. The memory 2124 can also store control parameters, calibration data, measurement data, or database data. The memory 2124 can also store configuration and operational data.

A computing system 2110 can have additional features, such as one or more of storage 2140, input devices 2150, output devices 2160, or communication ports 2170. An interconnection mechanism (not shown) such as a bus, controller, or network interconnects the components of the computing environment 2110. Typically, operating system software (not shown) provides an operating environment for other software executing in the computing environment 2110, and coordinates activities of the components of the computing environment 2110.

The tangible storage 2140 can be removable or non-removable, and includes magnetic disks, magnetic tapes or cassettes, CD-ROMs, DVDs, or any other medium which can be used to store information in a non-transitory way and which can be accessed within the computing environment 2110. The storage 2140 stores instructions of the software 2180 (including instructions and/or data) implementing one or more innovations described herein. Storage 2140 can also store image data, measurement data, reference data, calibration data, configuration data, or other databases or data structures described herein.

The input device(s) 2150 can be a mechanical, touch-sensing, or proximity-sensing input device such as a keyboard, mouse, pen, touchscreen, or trackball, a voice input device, a scanning device, or another device that provides input to the computing environment 2110. The output device(s) 2160 can be a display, printer, speaker, optical disk writer, or another device that provides output from the computing environment 2110. Input or output can also be communicated to/from a remote device over a network connection, via communication port(s) 2170.

The communication port(s) 2170 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 2110, either as an input device 2150 or coupled to a communication port 2170, and can include analog-to-digital converters or connections to an instrumentation bus. An instrumentation control system can be integrated into computing environment 2110, either as an output device 2160 or coupled to a communication port 2170, and can include digital-to-analog converters, switches, or connections to an instrumentation bus.

In some examples, computer system 2100 can also include a computing cloud 2190 in which instructions implementing all or a portion of the disclosed technology are executed. Any combination of memory 2124, storage 2140, and computing cloud 2190 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

ADDITIONAL EXAMPLES

The following are additional examples of the disclosed technologies.

Example 1 is an apparatus, including: an etcher; computer-readable media storing instructions; and one or more hardware processors with memory coupled thereto, the one or more hardware processors further coupled to the etcher and the computer-readable media; wherein the instructions, when executed by the one or more hardware processors, cause the apparatus to: delayer a sample while monitoring one or more signals from the sample; identify successive layers of the sample based on peaks or troughs of the monitored signal(s); retrospectively change a layer identification of a prior peak or trough, responsive to detection of a given inflection of the monitored signal(s); suspend delayering when a predetermined target layer of the sample is reached, wherein identification of the predetermined target layer is dependent on the changed layer identification.

Example 2 includes the subject matter of Example 1, and further specifies that the prior peak or trough is changed by the changing operation from a disregarded peak or trough to a peak or trough identifying a particular layer among the successive layers.

Example 3 includes the subject matter of any of Examples 1-2, and further specifies that the prior peak or trough is changed by the changing operation from a peak or trough identifying a particular layer among the successive layers to a disregarded peak or trough.

Example 4 includes the subject matter of any of Examples 1-3, and further specifies that the layer identification is changed, by the changing operation, based on an updated amplitude threshold, the amplitude threshold being updated responsive to the detection of the given peak or trough.

Example 5 includes the subject matter of any of Examples 1-4, and further specifies that the layer identification is changed, by the changing operation, based on periodicity of the peaks or troughs.

Example 6 includes the subject matter of any of Examples 1-5, and further specifies that the instructions further cause the apparatus to perform endpoint detection, with one or more adaptive parameters, to detect the peaks and troughs and identify the successive layers of the sample.

Example 7 includes the subject matter of Example 6, and further specifies that the sample is a first sample and the instructions further cause the adaptive parameter(s) to be stored for use in delayering a second sample.

Example 8 includes the subject matter of any of Examples 6-7, and further specifies that the endpoint detection is performed using a state machine.

Example 9 includes the subject matter of any of Examples 6-8, wherein the adaptive parameter(s) include a width of an averaging window, and the instructions further cause the width of the averaging window to be updated based on one or more waveform parameters of the monitored signal(s).

Example 10 includes the subject matter of any of Examples 1-9, and further specifies that: responsive to the detection of another peak or trough, the instructions further cause another review of the prior peak or trough; and responsive to the another review, layer identifications are maintained unchanged.

Example 11 includes the subject matter of any of Examples 1-10, and further specifies that the etcher is configured to generate a focused ion beam (FIB).

Example 12 includes the subject matter of any of Examples 1-11, and further includes a scanning electron microscope (SEM) configured to generate images of the sample during the delayer operation, wherein the monitored signal(s) comprise a parameter derived from the images.

Example 13 is a method, including: delayering a semiconductor device while monitoring one or more signals from the semiconductor device; identifying layers of the semiconductor device based on reference points of the monitored signal(s); responsive to detection of a given reference point of the monitored signal(s), retrospectively changing a layer identification of a prior reference point; and suspending the delayering dependent on the changed layer identification.

Example 14 includes the subject matter of Example 13, and further specifies: responsive to the detection of the given reference point, updating an amplitude threshold; and the changing comprises changing the prior reference point, based on the updated amplitude threshold, from a reference point identifying a particular layer among the successive layers to a disregarded reference point.

Example 15 includes the subject matter of any of Examples 13-14, and further specifies: responsive to the detection of the given reference point, determining that a spacing between the given reference point and a preceding reference point exceeds a period of the layers; and the changing comprises changing the prior reference point from a disregarded reference point to a reference point identifying a particular layer among the successive layers.

Example 16 includes the subject matter of any of Examples 13-15, and further specifies that the semiconductor device is a memory device and the delayering is paused or halted at or below the tenth metal layer of the memory device.

Example 17 includes the subject matter of any of Examples 13-16, and further specifies that the semiconductor device is a logic device and the delayering is paused or halted at or below the third via layer of the logic device.

Example 18 includes the subject matter of any of Examples 13-17, and further specifies that: responsive to the suspending of the delayering, performing an analysis on the semiconductor device.

Example 19 includes the subject matter of any of Examples 13-18, and further specifies that the monitored signal(s) comprise an electrical current.

Example 20 includes the subject matter of any of Examples 13-19, and further specifies that the suspending is based on the given reference point being determined to be beyond a predetermined target layer, as a result of the changed layer identification.

Example 21 includes the subject matter of any of Examples 13-19, and further specifies that the suspending is based on the given reference point being determined to be an endpoint of a predetermined target layer, as a result of the changed layer identification.

Example 22 is one or more computer-readable storage media storing instructions which, when executed by one or more hardware processors, cause the one or more hardware processors to perform operations, comprising: monitoring one or more signals from the semiconductor device during delayering of the semiconductor device; identifying layers of the semiconductor device based on inflections of the monitored signal(s); responsive to detection of a given inflection of the monitored signal(s), retrospectively updating a layer identification of a prior inflection; and controlling the delayering based on the revised layer identification.

Example 23 includes the subject matter of Example 22, and further specifies that the controlling comprises suspending the delayering at a predetermined target layer.

Example 24 includes the subject matter of any of Examples 22-23, and further specifies that, before the changing or after the changing, the given inflection and the prior inflection are endpoints of distinct respective layers.

Example 25 includes the subject matter of any of Examples 22-24, and further specifies that the given inflection and the prior inflection are separated by an endpoint of an intervening layer.

Example 26 includes the subject matter of any of Examples 22-25, and specifies that the operations further comprise, responsive to the detection of the given inflection, a replay of past inflections with the past inflections being re-evaluated based on up-to-date criteria; and the retrospective updating is based on the re-evaluation of the prior inflection.

Example 27 includes the subject matter of any of Examples 22-26, and further specifies that the delayering is controlled by a first set of parameters up to a predetermined layer of the semiconductor device, and the controlling comprises switching the delayering to a second set of parameters responsive to reaching the predetermined layer.

General Considerations

As used in this application and in the claims, the singular forms “a,” “an,” and “the” include the plural forms unless the context clearly dictates otherwise. Additionally, the term “includes” means “comprises.” Further, the term “coupled” does not exclude the presence of intermediate elements between the coupled items. Furthermore, as used herein, the terms “or” and “and/or” mean any one item or combination of items in the phrase.

The systems, methods, and apparatus described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like “adapt,” “analyze,” “average,” “change,” “control,” “detect,” “determine,” “evaluate,” “extract,” “filter,” “halt,” “identify,” “invoke,” “pause,” “produce,” “provide,” “resume,” “store,” “suspend,” “switch,” “trigger,” “update,” or “wait” to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as “lowest,” “best,” “minimum,” “optimum” or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 21, computer-readable storage media include memory 2124, and storage 2140. The terms computer-readable storage media or computer-readable media do not include signals and carrier waves. In addition, the terms computer-readable storage media or computer-readable media do not include communication ports (e.g., 2170).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

APPENDIX—EXAMPLE ENDPOINT DETECTION PARAMETERS

This Appendix describes example parameters that can be used in an Endpoint Detection (EPD) procedure.

1. Acceptance Threshold (Predetermined):

Any value below this threshold can be ignored by the endpoint detection procedure.

Note: This parameter can be used to filter out outlier measurements that either result from e.g. a read error from an ammeter or lack of synchronization between the start of scan and start of stage current readings.

2. Filter Duplicates (Predetermined):

Detects sequential inputs with the same value—all but the first input can be ignored by the EPD procedure.

3. Initial Window for Averaging (s) (Predetermined):

The period in seconds over which input values are averaged for noise reduction. It is referred to as the "initial" window because when adaptive averaging is enabled, a new window may be calculated as the procedure acquires information.

4. Spread Threshold (Dynamic):

When delayering starts, the EPD procedure can wait until the difference between the maximum signal value and minimum signal value received up to that point is as large as this threshold before transitioning to the "looking-for-peak" or "looking-for-trough" state.

5. Peak Transition Threshold Coefficient (Dynamic):

After detecting a trough, the EPD procedure can wait until the input signal value has increased to a certain threshold before transitioning to the "looking-for-peak" state. This threshold is defined as follows:

$$T = PTC * MPH$$

Where

T=Threshold

PTC=Peak transition threshold coefficient (predetermined)

MPH=Median peak height (dynamic)

6. Trough Transition Threshold Coefficient (Dynamic):

After detecting a peak, the EPD procedure can wait until the input signal value has decreased to a certain threshold before transitioning to the "looking-for-trough" state. This threshold is defined as follows:

$$T = TTC * LPH$$

Where

T=Threshold

TTC=Trough transition threshold coefficient (predetermined)

LPH=Last peak height (dynamic)

7. Enable Adaptive Averaging (Predetermined):

This specifies whether the adaptive averaging feature is enabled or disabled. If disabled, the "initial averaging window" can be used for noise filtering throughout the pattern. If enabled, the procedure can adjust the averaging window as it gains information.

8. Num Averaging Windows Per Peak (Dynamic):

If adaptive averaging is enabled, the procedure can redefine the averaging window after each endpoint detection, starting after two endpoints have been detected. The averaging window is defined as follows:

$$W = (LPW + LTW) / NWPP$$

Where

W=Window

LPW=Last peak spacing from its preceding trough (dynamic)

LTW=Last trough spacing from its preceding peak (dynamic)

NWPP=Num averaging windows per peak (predetermined)

9. Enable Periodicity Correction (Predetermined):

This specifies whether the periodicity-correction feature is enabled or disabled. If enabled, the procedure can attempt to retroactively identify peaks that are shorter than the threshold defined in the "peak transition threshold coefficient" section. Peak/trough pairs that fulfill the criteria defined by both the "spacing tolerance" parameter and the "trough difference coefficient" parameter can be detected by the procedure.

10. Spacing Tolerance (Predetermined):

To determine whether a given peak qualifies as a "short peak", the relative spacing can be defined as follows and calculated based on corresponding measurements:

$$RW=PW/LPW$$

Where

RW=Relative spacing

PW=Peak spacing (dynamic)

LPW=Last peak spacing (dynamic)

If the following is satisfied:

$$RW>=1.0-WT \;\&\&\; RW<=1.0+WT$$

Where

WT=Spacing tolerance then the peak qualifies.

11. Trough Difference Coefficient (Dynamic):

If a "short peak" is identified using the criteria above, the procedure begins looking for a trough. The trough spacing (as measured from the short peak) must meet the same criteria as above. The relative spacing can be defined as follows:

$$RW=TW/LTW$$

Where

RW=Relative spacing

PW=Trough spacing (dynamic)

LTW=Last trough spacing (dynamic)

If the following is satisfied:

$$RW>=1.0-WT \;\&\&\; RW<=1.0+WT$$

Where

WT=Spacing tolerance

Then the trough difference can be tested based on the following definition:

$$TD=TV-LTV$$

Where

TD=Trough difference

TV=Trough value (dynamic)

LTV=Last trough value (dynamic)

The trough difference threshold (dynamic) can be defined and calculated as follows $$TDT=TDC*MPH$$

Where

TDT=Trough difference threshold

TDC=Trough difference coefficient (dynamic)

MPH=Median peak height (dynamic)

We claim:

1. An apparatus comprising:

an etcher;

computer-readable media storing instructions; and one or more hardware processors with memory coupled thereto, the one or more hardware processors further coupled to the etcher and the computer-readable media;

wherein the instructions, when executed by the one or more hardware processors, cause the apparatus to:

delayer a sample while monitoring one or more signals from the sample;

identify successive layers of the sample based on inflections, comprising peaks or troughs, of the monitored signal(s);

responsive to detection of a given inflection of the monitored signal(s):

retrospectively change, as a changing operation, a layer identification of a prior inflection, distinct from the given inflection; and suspend delayering when a predetermined target layer of the sample is reached, wherein identification of the predetermined target layer is dependent on the changed layer identification.

2. The apparatus of claim 1, wherein the prior peak or trough is changed by the changing operation from a disregarded inflection to an inflection identifying a particular layer among the successive layers.

3. The apparatus of claim 1, wherein the prior inflection is changed by the changing operation from an inflection identifying a particular layer among the successive layers to a disregarded inflection.

4. The apparatus of claim 1, wherein the layer identification is changed, by the changing operation, based on an updated amplitude threshold, the amplitude threshold being updated responsive to the detection of the given inflection.

5. The apparatus of claim 1, wherein the layer identification is changed, by the changing operation, based on periodicity of the peaks or troughs.

6. The apparatus of claim 1, wherein the instructions further cause the apparatus to perform endpoint detection, with one or more adaptive parameters, to detect the peaks and the troughs, and to identify the successive layers of the sample.

7. The apparatus of claim 6, wherein the sample is a first sample and the instructions further cause the adaptive parameter(s) to be stored for use in delayering a second sample.

8. The apparatus of claim 6, wherein the adaptive parameter(s) include a width of an averaging window, and the instructions further cause the width of the averaging window to be updated based on one or more waveform parameters of the monitored signal(s).

9. The apparatus of claim 1, wherein the etcher is configured to generate a focused ion beam (FIB) and the apparatus further comprises: a scanning electron microscope (SEM) configured to generate images of the sample during the delayer operation, wherein the monitored signal(s) comprise a parameter derived from the images.

10. A method comprising:

delayering a sample while monitoring one or more signals from the sample;

identifying successive layers of the sample based on inflections, comprising peaks or troughs, of the monitored signal(s);

responsive to detection of a given inflection of the monitored signal(s):

retrospectively changing, as a changing operation, a layer identification of a prior inflection, distinct from the given inflection; and suspending the delayering when a predetermined target layer of the sample has been reached, wherein identification of the predetermined target layer is dependent on the changed layer identification;

wherein the method is performed by an apparatus through execution of instructions by one or more hardware processors;

wherein the apparatus comprises an etcher, computer-readable media storing the instructions and, coupled to the etcher and to the computer-readable media, the one or more hardware processors with memory coupled thereto.

11. The method of claim 10, further comprising:

responsive to the detection of the given inflection, updating an amplitude threshold; and the changing operation comprises changing the prior inflection, based on the updated amplitude threshold, from an inflection identifying a particular layer among the successive layers to a disregarded inflection.

12. The method of claim 10, further comprising:

responsive to the detection of the given inflection, determining that a spacing between the given inflection and a preceding inflection exceeds a period of the layers; and the changing operation comprises changing the prior inflection from a disregarded inflection to an inflection identifying a particular layer among the successive layers.

13. The method of claim 10, wherein the sample is a semiconductor memory device and the delayering is paused or halted at or below a tenth metal layer, in order of delayering, of the semiconductor memory device; or the sample is a semiconductor logic device and the delayering is paused or halted at or below a third via layer, in order of delayering, of the semiconductor logic device.

14. The method of claim 10, further comprising:

responsive to the suspending of the delayering, performing an analysis on the sample.

15. The method of claim 10, wherein the monitored signal(s) comprise an electrical current.

16. The method of claim 10, wherein the suspending is based on the given inflection being determined to be beyond the predetermined target layer, as a result of the changed layer identification.

17. The method of claim 10, wherein the suspending is based on the given inflection being determined to be an endpoint of the predetermined target layer, as a result of the changed layer identification.

18. One or more computer-readable storage media coupled to one or more hardware processors, in turn coupled to memory and to an etcher, the one or more computer-readable storage media storing instructions which, when executed by the one or more hardware processors, cause the one or more hardware processors to perform operations comprising:

monitoring one or more signals from a sample during delayering of the sample;

identifying successive layers of the sample based on inflections, comprising peaks or troughs, of the monitored signal(s);

responsive to detection of a given inflection of the monitored signal(s):

retrospectively changing, as a changing operation, a layer identification of a prior inflection distinct from the given inflection; and suspending the delayering when a predetermined target layer of the sample is reached, wherein identification of the predetermined target layer is dependent on the changed layer identification.

19. The computer-readable storage media of claim 18 wherein, before the changing operation or after the changing operation, the given inflection and the prior inflection are endpoints of distinct respective layers.

20. The computer-readable storage media of claim 18, wherein the operations further comprise, responsive to the detection of the given inflection, a replay of past inflections with the past inflections being re-evaluated based on up-to-date criteria; and the changing operation is based on the re-evaluation of the prior inflection.

21. The computer-readable storage media of claim 18, wherein the delayering is controlled by a first set of parameters up to a predetermined layer of the sample, and the operations further comprise; switching the delayering to a second set of parameters responsive to reaching the predetermined layer.

* * * * *